(12) United States Patent
Baek

(10) Patent No.: US 11,107,514 B2
(45) Date of Patent: Aug. 31, 2021

(54) ELECTRONIC DEVICE

(71) Applicant: SK hynix Inc., Icheon-si (KR)

(72) Inventor: Seung-Heon Baek, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/828,184

(22) Filed: Mar. 24, 2020

(65) Prior Publication Data

US 2021/0098042 A1   Apr. 1, 2021

(30) Foreign Application Priority Data

Sep. 30, 2019  (KR) .................. 10-2019-0120387

(51) Int. Cl.
  *G11C 11/14*   (2006.01)
  *G11C 11/16*   (2006.01)
  *G06F 9/22*   (2006.01)

(52) U.S. Cl.
  CPC .......... *G11C 11/1675* (2013.01); *G06F 9/223* (2013.01); *G11C 11/161* (2013.01); *G11C 11/1659* (2013.01); *G11C 11/1673* (2013.01); *G11C 11/1655* (2013.01); *G11C 11/1657* (2013.01)

(58) Field of Classification Search
  CPC .............. G11C 11/1675; G11C 11/161; G11C 11/1659; G11C 11/1673; G06F 9/223
  USPC .................................................... 365/189.09
  See application file for complete search history.

(56) References Cited

U.S. PATENT DOCUMENTS

| | | | | |
|---|---|---|---|---|
| 7,898,838 B2 * | 3/2011 | Chen | .................. | G11C 11/1673 365/148 |
| 7,948,813 B2 * | 5/2011 | Abe | .................... | G11C 11/1659 365/189.16 |
| 10,096,351 B2 | 10/2018 | Worledge | | |
| 10,490,741 B2 * | 11/2019 | Choi | .................. | H01L 45/1233 |
| 2010/0080054 A1 * | 4/2010 | Abe | .................... | G11C 11/1673 365/171 |

(Continued)

FOREIGN PATENT DOCUMENTS

KR   20150082747 A   7/2015

OTHER PUBLICATIONS

Jeong, G. et al., "A 0.24 um 2.0-V 1T1MTJ 16-kb Nonvolatile Magnetoresistance RAM With Self-Reference Sensing Scheme." IEEE Journal of Solid-State Circuits. vol. 38, No. 11, Nov. 2003, 5 pages.

*Primary Examiner* — Xiaochun L Chen
(74) *Attorney, Agent, or Firm* — Perkins Coie LLP

(57) ABSTRACT

An electronic device includes a semiconductor memory. The semiconductor memory includes a memory cell array of a plurality of memory cells each including a variable resistance element and outputting, to a corresponding bit line, a cell voltage corresponding to a resistance value of the variable resistance element; a driving control circuit operable to control a reference data to be written in a selected memory cell among the memory cells, during a sensing operation; a resistance monitoring circuit operable to receive the cell voltage of the selected memory cell and output a monitoring voltage based on the cell voltage at the bit line, the monitoring voltage corresponding to a change in the resistance value during the sensing operation; and an amplifying circuit operable to amplify the monitoring voltage and output an amplified monitoring voltage as output data.

27 Claims, 21 Drawing Sheets

(56) References Cited

U.S. PATENT DOCUMENTS

| | | | |
|---|---|---|---|
| 2010/0110760 A1* | 5/2010 | Chen | G11C 13/004 365/148 |
| 2014/0063981 A1* | 3/2014 | Hong | G11C 11/4094 365/189.09 |
| 2017/0062712 A1* | 3/2017 | Choi | H01L 43/08 |

* cited by examiner

| REFERENCE DATA | ORIGINAL DATA | V2 | V3 | DOUT | WRITE-BACK |
|---|---|---|---|---|---|
| H (R_H = 'H') | L | + | + | L | O |
| | H | 0 | 0 | H | X |
| L (R_L = 'H') | L | 0 | 0 | L | X |
| | H | − | + | H | O |

| REFERENCE DATA | ORIGINAL DATA | V2 | V3 | DOUT | WRITE-BACK |
|---|---|---|---|---|---|
| H (R_H = 'H') | L | − | + | L | O |
|  | H | 0 | 0 | H | X |
| L (R_L = 'H') | L | 0 | 0 | L | X |
|  | H | + | + | H | O | ns
ELECTRONIC DEVICE

CROSS-REFERENCE TO RELATED APPLICATION

This patent document claims priority to and benefits of Korean Patent Application No. 10-2019-0120387, entitled "ELECTRONIC DEVICE" and filed on Sep. 30, 2019, which is incorporated herein by reference in its entirety.

TECHNICAL FIELD

This patent document relates to memory circuits or devices and their applications in electronic devices or systems.

DISCUSSION OF THE RELATED ART

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a switching characteristic between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory having a self-reference sensing scheme, the semiconductor memory capable of reducing a read latency as well as reducing read errors.

In one aspect, an electronic device may include a semiconductor memory, the semiconductor memory including: a memory cell array of a plurality of memory cells each including a variable resistance element exhibiting different resistance values representing different digital information and outputting, to a corresponding bit line, a cell voltage corresponding to a resistance value of the variable resistance element; a driving control circuit coupled to the memory cell array and operable to control a reference data to be written in a selected memory cell among the memory cells, during a sensing operation; a resistance monitoring circuit coupled to the memory cell array and operable to receive the cell voltage of the selected memory cell and output a monitoring voltage based on the cell voltage at the bit line, the monitoring voltage corresponding to a change in the resistance value during the sensing operation; and an amplifying circuit coupled to the resistance monitoring circuit and operable to amplify the monitoring voltage and output an amplified monitoring voltage as output data.

Implementations of the above electronic device may include one or more the following.

The variable resistance element may store different data depending on whether the variable resistance element has a high resistance state or a low resistance state. The resistance monitoring circuit may include: a differential circuit configured to differentiate the cell voltage and output the monitoring voltage based on the change of the cell voltage. The semiconductor memory may further include: a level adjusting circuit configured to adjust a level of the monitoring voltage and transfer the adjusted monitoring voltage to the sense amplifying circuit. The resistance monitoring circuit may output the monitoring voltage having a positive value (+), a value of 0, or a negative value (−). The resistance monitoring circuit may include: a capacitor coupled between an input terminal receiving the cell voltage and an output terminal outputting the monitoring voltage; and a resistor coupled between the output terminal and a ground voltage terminal. The resistance monitoring circuit may include: a first transistor coupled between a supply voltage terminal and a first node, and having a gate receiving a voltage of the first node; a second transistor coupled between the first node and a ground voltage terminal, and having a gate receiving the cell voltage; a capacitor coupled between the first node and an output terminal outputting the monitoring voltage; and a resistor coupled between the output terminal and the ground voltage terminal. The resistance monitoring circuit may include: a capacitor coupled between an input terminal receiving the cell voltage and a second node; an operational amplifier configured to receive a voltage of the second node as a negative input terminal and a ground voltage as a positive input terminal, and output the monitoring voltage to an output terminal; and a resistor coupled between the second node and the output terminal. The resistance monitoring circuit may include: a first monitor circuit configured to operate in response to a signal activated when the reference data has a high resistance state and to output the monitoring voltage by monitoring the change in the resistance value according to the cell voltage; and a second monitor circuit configured to operate in response to a signal activate suitable for outputting the monitoring voltage by monitoring the change in the resistance value according to the cell voltage, in case where the reference data is 'low' data. The first monitor circuit may include: a capacitor coupled between an input terminal receiving the cell voltage and an output terminal outputting the monitoring voltage; and a resistor coupled between the output terminal and a ground voltage terminal. The first monitor circuit may include: a first transistor coupled between a supply voltage terminal and a first node, and having a gate receiving a voltage of the first node; a second transistor coupled between the first node and a ground voltage terminal, and having a gate receiving the cell voltage; a capacitor coupled between the first node and an output terminal outputting the monitoring voltage; and a resistance element coupled between the output terminal and the ground voltage terminal. The second monitor circuit may include: a capacitor coupled between an input terminal receiving the cell voltage and a second node; an operational amplifier configured to receive a voltage of the second node as a negative input terminal and a ground voltage as a positive input terminal, and to output the monitoring voltage to an output terminal; and a resistance element coupled between the second node and the output terminal. The driving control circuit may read, before the sensing operation, an original data stored in the selected memory cell, and allow the original data to be written, after the sensing operation, back to the selected memory cell based on the output data. The driving control circuit may allow the original data to be written back to the selected memory cell when the output data indicates that there exists the change in the resistance value during the sensing operation. The driving control circuit may include: at least one current source configured to provide a read current or a write current to the bit line coupled to the selected memory cell. The sensor amplifying circuit may include inverters that are cross coupled The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In one aspect, a method of operating an electronic device having a semiconductor memory, may include: writing, during a sensing operation, a reference data in a selected memory cell among memory cells included in the semiconductor memory, each memory cell including a variable resistance element that exhibits either high or low resistance value; monitoring, during the sensing operation, a change in a resistance value of the selected memory cell based on a cell voltage at a bit line coupled to the selected memory cell and outputting a monitoring voltage corresponding to a result of the monitoring; and amplifying the monitoring voltage and outputting the amplified monitoring voltage as output data.

Implementations of the above electronic device may include one or more the following.

The monitoring of the change in the resistance value of the selected memory cell may include: differentiating the cell voltage to output the monitoring voltage. The method may further include: reading, before the sensing operation, an original data that is stored in the selected memory cell; and writing the original data to the selected memory cell based on the output data. The writing of the original data may be performed when the output data indicates that there exists the change in the resistance value during the sensing operation. The method may further include: adjusting a level of the monitoring voltage. The adjusted level of the monitoring voltage may have a positive value (+), a value of 0, or a negative value (−).

These and other aspects, implementations and associated advantages are described in greater detail in the drawings, the description and the claims.

DETAILED DESCRIPTION

Figure 1:
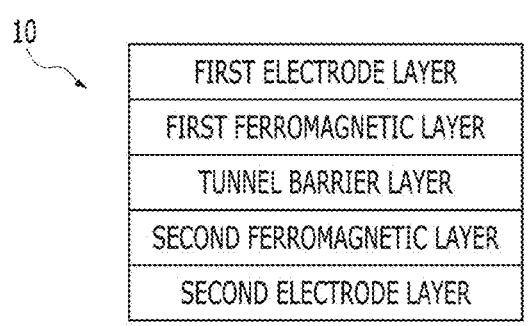
FIG. 1 is a diagram showing an example of a magnetic tunnel junction (MTJ) as one of structures having a tunnel barrier layer interposed between two ferromagnetic layers.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

A semiconductor memory in accordance with implementations of the disclosed technology may include a variable resistance element that exhibits a variable resistance characteristic that allows for exhibiting different resistance values that represent different digital bits or states, respectively. Such a semiconductor memory can include a memory cell array of memory cells formed by variable resistance elements to store data. In implementations, such a variable resistance element may include a single layer or a multi-layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (WO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

In various implementations, the variable resistance element may include a phase change material. The phase change material may include a chalcogenide material such as germanium-antimony-tellurium (GST: GeSbTe). The variable resistance element switches between different resistance states by changing a material state of the phase change material in either a crystal state or an amorphous state by changing the temperature, e.g., via a control of the heating or cooling of the variable resistance element.

The variable resistance element may include two magnetic layers and a tunnel barrier layer interposed between the two magnetic layers. One of the magnetic layers may include nickel-ferrum-cobalt (NiFeCo) or Cobalt-ferrum (CoFe), etc. The tunnel barrier layer may include aluminum oxide $Al_2O_3$. The variable resistance element may switch between two different resistance states corresponding to different relative magnetization directions of the two magnetic layers with respect to each other. For example, the variable resistance element may be in a low-resistance state when magnetization directions of the two magnetic layers are parallel along the same direction, and the variable resistance element may be in a high-resistance state when the magnetization directions of the two magnetic layers are anti-parallel with respect to each other.

FIG. 1 is a diagram showing an example of a magnetic tunnel junction (MTJ) 10 as one of structures having a tunnel barrier layer interposed between two ferromagnetic layers.

As shown in FIG. 1, the MTJ 10 includes a first electrode layer as a top electrode, a second electrode layer as a bottom electrode, a pair of ferromagnetic layers including a first ferromagnetic layer and a second ferromagnetic layer, and a tunnel barrier layer which is formed between the pair of ferromagnetic layers.

The first ferromagnetic layer may be or include a free ferromagnetic layer of which magnetization direction may be changed depending on the direction of the current applied to the MTJ 10, and the second ferromagnetic layer may be or include a pinned ferromagnetic layer of which magnetization direction is pinned to a fixed direction.

Such an MTJ 10 exhibits different resistance states and can switch between the different resistance states depending on the direction of the current, and the MTJ 100 is configured to store data "0" or "1" depending on its resistance state.

Figure 2A:
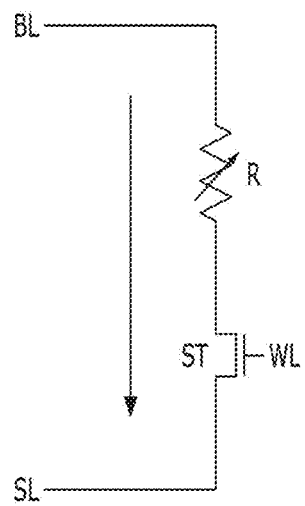
FIGS. 2A and 2B are views explaining a principle of storing data in a variable resistance element.
Figure 2B:
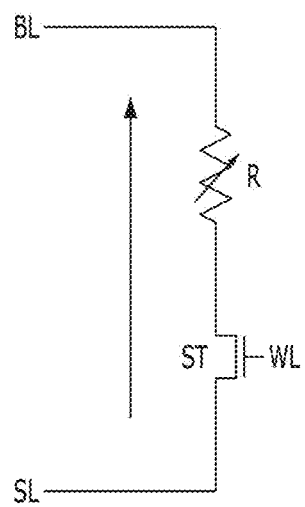

FIGS. 2A and 2B are views explaining a principle of storing data in a variable resistance element R. The variable resistance element R may be or include the MTJ 10 described above with reference to FIG. 1.

First, FIG. 2A is a diagram explaining a principle of recording data with a logic low value in the variable resistance element R. In order to select the variable resistance element R to store data, a word line WL electrically coupled to the variable resistance element R is activated and thus a switching transistor ST is turned on. Once the switching transistor ST is turned on, a current can flow in the direction indicated by the arrow in FIG. 2A, that is, from the first electrode layer as the top electrode of the MTJ 10 shown in FIG. 1 to the second electrode layer as the bottom electrode of the MTJ 10 (in the direction indicated by the arrow). That is, the magnetization direction of the first ferromagnetic layer as the free ferromagnetic layer and the magnetization direction of the second ferromagnetic layer as the pinned ferromagnetic layer become parallel to each other, and the variable resistance element R has a low-resistance state. When the variable resistance element R is the low-resistance state, it is defined that 'low' data is stored in the variable resistance element R.

Next, FIG. 2B is a diagram explaining a principle of recording data with a logic high value in the variable resistance element R. In a similar manner, the word line WL electrically coupled to the variable resistance element R is activated, and thus the switching transistor ST is turned on. As a current flows in the direction indicated by the arrow in FIG. 2B, that is, from the second electrode layer to the first electrode layer, the magnetization direction of the first ferromagnetic layer and the magnetization direction of the second ferromagnetic layer become anti-parallel to each other, and the variable resistance element R has a high-resistance state. When the variable resistance element R is the high-resistance state, it is defined that 'high' data is stored in the variable resistance element R.

The logic value of the data stored in the variable resistance element R is changed depending on the resistance value of the variable resistance element R. In the case where the difference between the resistance values of the high-resistance state and the low-resistance state of the variable resistance element R is great, it is relatively easy to determine the data stored in the variable resistance element R. In the case where the difference between the resistance values of the high-resistance state and the low-resistance state of the variable resistance element R is small, it is relatively difficult to discriminate different resistance states and thus to determine the data stored in the variable resistance element R, which increases the probability of an error to occur in discriminating data. Therefore, there are demands for a sensing scheme capable of precisely discriminating the data stored in a variable resistance element R even when the difference between the resistance values of the high-resistance state and the low-resistance state of the variable resistance element R is small.

In a conventional sensing scheme, a data stored in a memory cell (hereinafter referred to as a 'target data') is read out, and the target data is compared with a data of an external resistor having a fixed resistance value. The data to be compared with the target data is referred to as a 'reference data'. If the target data is smaller than the reference data, it is determined that the 'low' data is stored in the variable resistance element R, otherwise the 'high' data is stored in the variable resistance element R. If the size of the memory cell is large, the distribution of the low-resistance state of the memory cell and the distribution of the high-resistance state of the memory cell do not overlap, so data sensing can be done well without any error only with the external resistor. However, as the size of the memory cell decreases, the distribution of the low-resistance state of the memory cell and the distribution of the high-resistance state of the memory cell begin to overlap. As a result, the probability of error (i.e., read error) in data sensing increases in the conventional sensing scheme using only the external resistor.

Meanwhile, the data stored in the variable resistance element R has a non-volatile capability in which the data can retain unless a special stimulus is given from the outside. A self-reference sensing scheme which has been proposed can be applied for sensing data in a non-volatile memory device.

Figure 3:
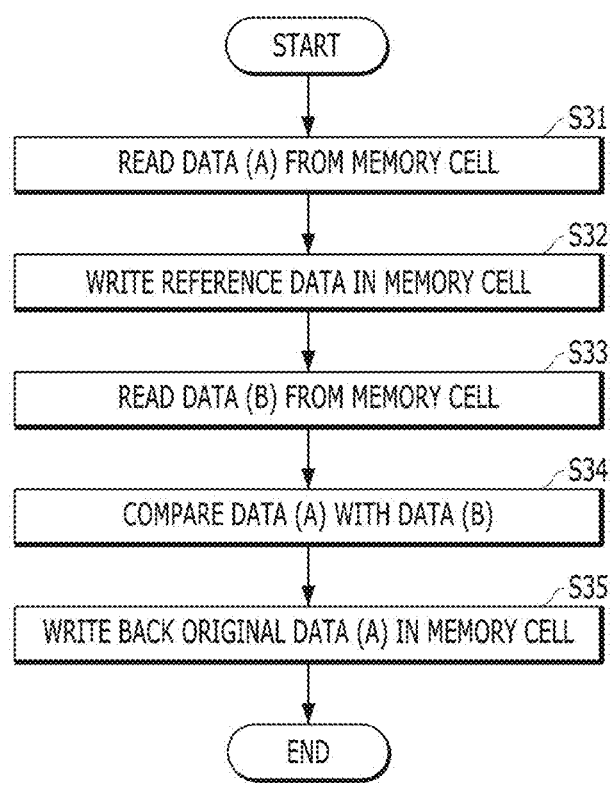
FIG. 3 is an example of a flow chart describing a self-reference sensing scheme of a semiconductor memory.
Figure 4:
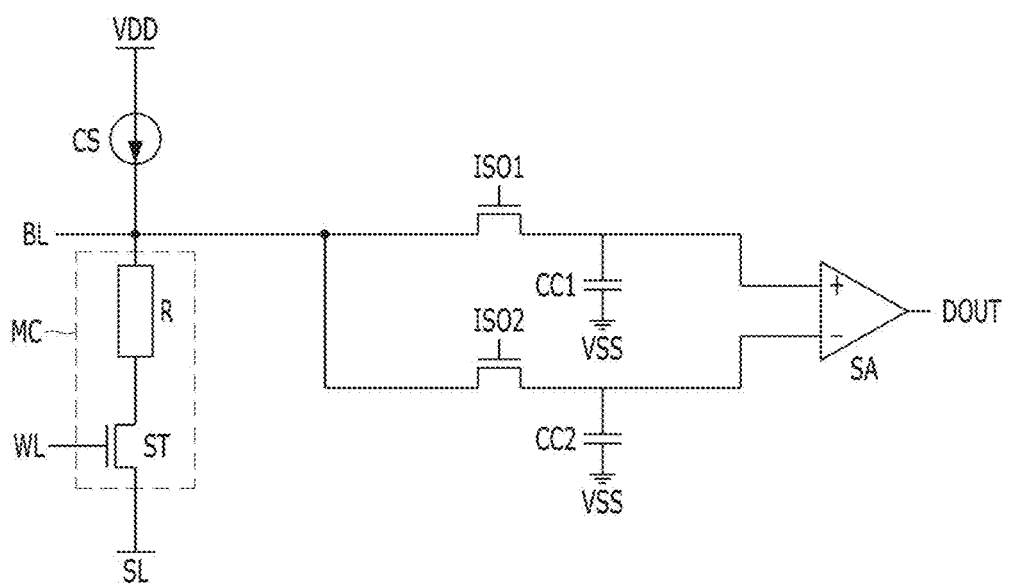
FIG. 4 is an example of a circuit diagram illustrating the semiconductor memory which performs the operations as shown in FIG. 3.

FIG. 3 is an example of a flow chart describing a self-reference sensing scheme of a semiconductor memory. FIG. 4 is a circuit diagram illustrating the semiconductor memory which performs the operations as shown in FIG. 3.

Referring to FIGS. 3 and 4, a word line WL electrically coupled to a variable resistance element R is activated and thus a switching transistor ST is turned on. A current source CS provides a read current to a memory cell MC so as to output data (A) corresponding to a resistance value of the memory cell MC to a bit line BL (at step S31). At this time, a first switching signal ISO1 is activated, and the data (A) output to the bit line BL may be stored in a storage device, e.g., a first capacitor CC1.

The current source CS provides a write current to the memory cell MC so as to write a 'high' data in the memory cell MC (at step S32). At this time, as shown in FIG. 2B, in order to write the 'high' data in the memory cell MC, the write current may be supplied to flow in a direction from a source line SL to the bit line BL.

Next, the current source CS provides a read current to the memory cell MC so as to output data (B) corresponding to the resistance value of the memory cell MC to the bit line BL (at step S33). At this time, a second switching signal 1502 is activated, and the data (B) output to the bit line BL may be stored in a storage device, e.g., a second capacitor CC2. The data (B) stored in the second capacitor CC2 may be used as a reference data.

In the example shown in FIG. 4, a sense amplifier SA coupled to the first and second capacitors CC1 and CC2 may output output data DOUT by comparing a value stored in the first capacitor CC1, which corresponds to the data (A), and a value stored in the second capacitor, which corresponds the data (B) (at step S34). The sense amplifier SA may output the output data DOUT of a logic high level when the data (A) is greater than or equal to the data (B), and output the output data DOUT of a logic low level when the data (A) is less than the data (B).

Then, the current source CS provides a write current to the memory cell MC, allowing the memory cell MC to retain the original data (i.e. data (A)) (at step S35). When the output data DOUT in the step S34 is 'high' data, the step S35 may be omitted.

As mentioned above, the self-reference sensing scheme does not use the external resistor for reading data stored in the memory cell. Instead, the self-reference sensing scheme allows to write certain data in the memory cell MC, then read out the data written in the memory cell, and use the read data as the reference data. Thus, even if the cell resistance distribution increases and becomes wider, the self-reference sensing scheme can significantly reduce read errors compared to the conventional sensing scheme. However, as described in FIG. 3, because the self-reference sensing scheme is performed with four cycles of read-write-read-write (recovery) operations, the self-reference sensing scheme may have a read latency four times longer than the conventional sensing scheme, compared to the conventional sensing scheme that is performed with only a read operation.

Hereinafter, in the proposed technology in this patent document, a method for reducing read error while reducing read latency in a self-reference sensing scheme will be explained.

Figure 5:
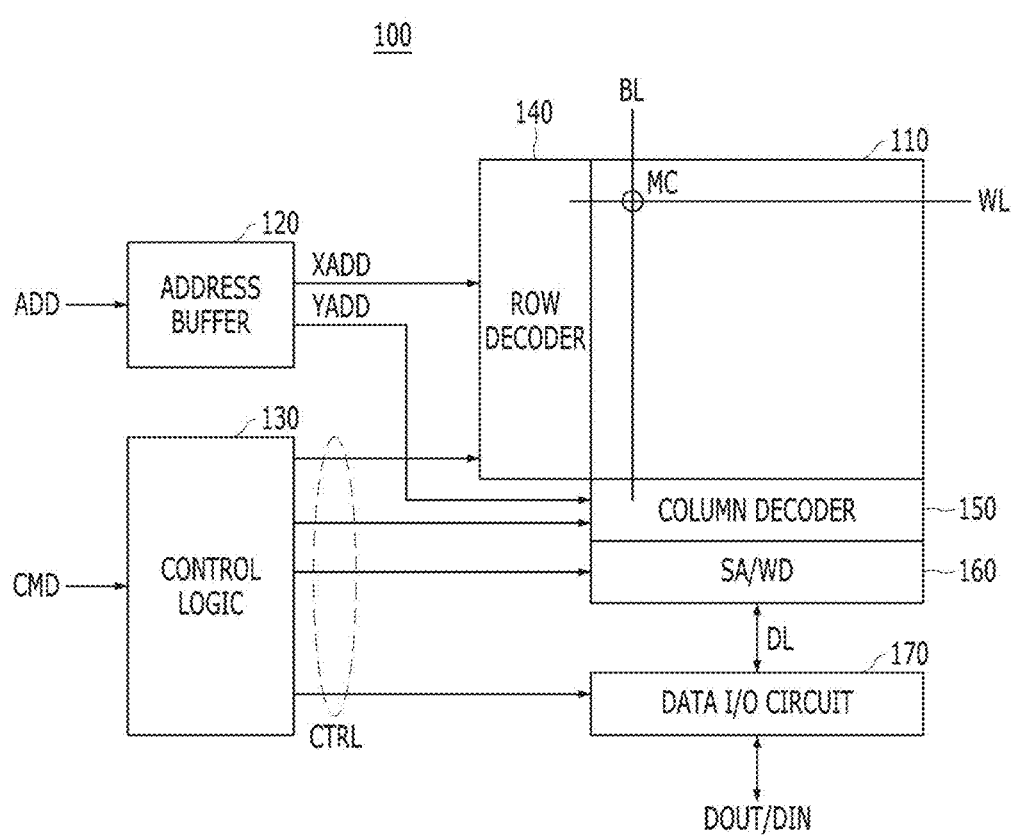
FIG. 5 is a configuration diagram illustrating a representation of an example of a semiconductor memory in accordance with an embodiment.

FIG. 5 is a configuration diagram illustrating a representation of an example of a semiconductor memory 100 in accordance with an embodiment.

Referring to FIG. 5, the semiconductor memory 100 may include a memory cell array 110 of memory cells for storing data, an address buffer 120, a control logic 130, a row decoder 140, a column decoder 150, a sense amplifier/write driver (SA/WD) 160, and a data input/output (I/O) circuit 170.

The memory cell array 110 may include a plurality of word lines WL, a plurality of bit lines BL, and a plurality of memory cells MC that form the memory cell array 110 and are positioned at different intersections of the word lines WL and the bit lines BL. The plurality of memory cells MC may be implemented with resistive memory cells. Each of the plurality of memory cells MC may include a variable resistance element R exhibiting different resistance values for representing different digital data and a switching transistor ST, as described in FIGS. 1 to 2B. The plurality of memory cells MC may output data based on a low-resistance state or a high-resistance state of the variable resistance element R, to a bit line BL coupled to a selected memory cell MC.

The address buffer 120 may store an address ADD provided from an external controller (nor shown), provide a row address XADD among the address ADD to the row decoder 140, and provide a column address YADD to the column decoder 150.

The control logic 130 may control an overall operation of the semiconductor memory 100 according to a command CMD provided from the external controller. The control logic 130 may generate control signals CTRL by decoding the command CMD, to control the row decoder 140, the column decoder 150, the SA/WD 160 and the data I/O circuit 170. The command CMD may include a least one of a chip select signal/CS, a row address strobe signal/RAS, a column address strobe signal/CAS, a write enable signal/WE, a clock enable signal CKE, or any other signals.

The row decoder 140 may decode the row address XADD to generate a signal for activating one of the plurality of word lines WL. The column decoder 150 may decode the column address YADD to activate a signal for selecting one of the plurality of bit lines BL. By selecting a specific word line and a specific column line, a certain memory cells which is designated by the address ADD may be selected in the memory cell array 110.

The SA/WD 160 may include a write driver WD and a sense amplifier SA. During a write operation, the write driver WD may provide write data transferred from data lines to the selected bit line BL. During a read operation, the sense amplifier SA may sense and amplify read data output from the selected bit line BL, and provide the amplified read data to data lines DL. In the example of implementing the proposed technology, the sense amplifier SA may operate according to the self-reference sensing scheme. Thus, a reference data of an external resistor having a fixed resistance value is not used to read data. For the read operation, a specific data may be written in the memory cell MC and then the written data is used as the reference data.

The data I/O circuit 170 may transfer the write data as input data DIN from the controller to the data lines DL during the write operation, and output the read data as output data DOUT from the data lines DL to the controller during the read operation.

Figure 6:
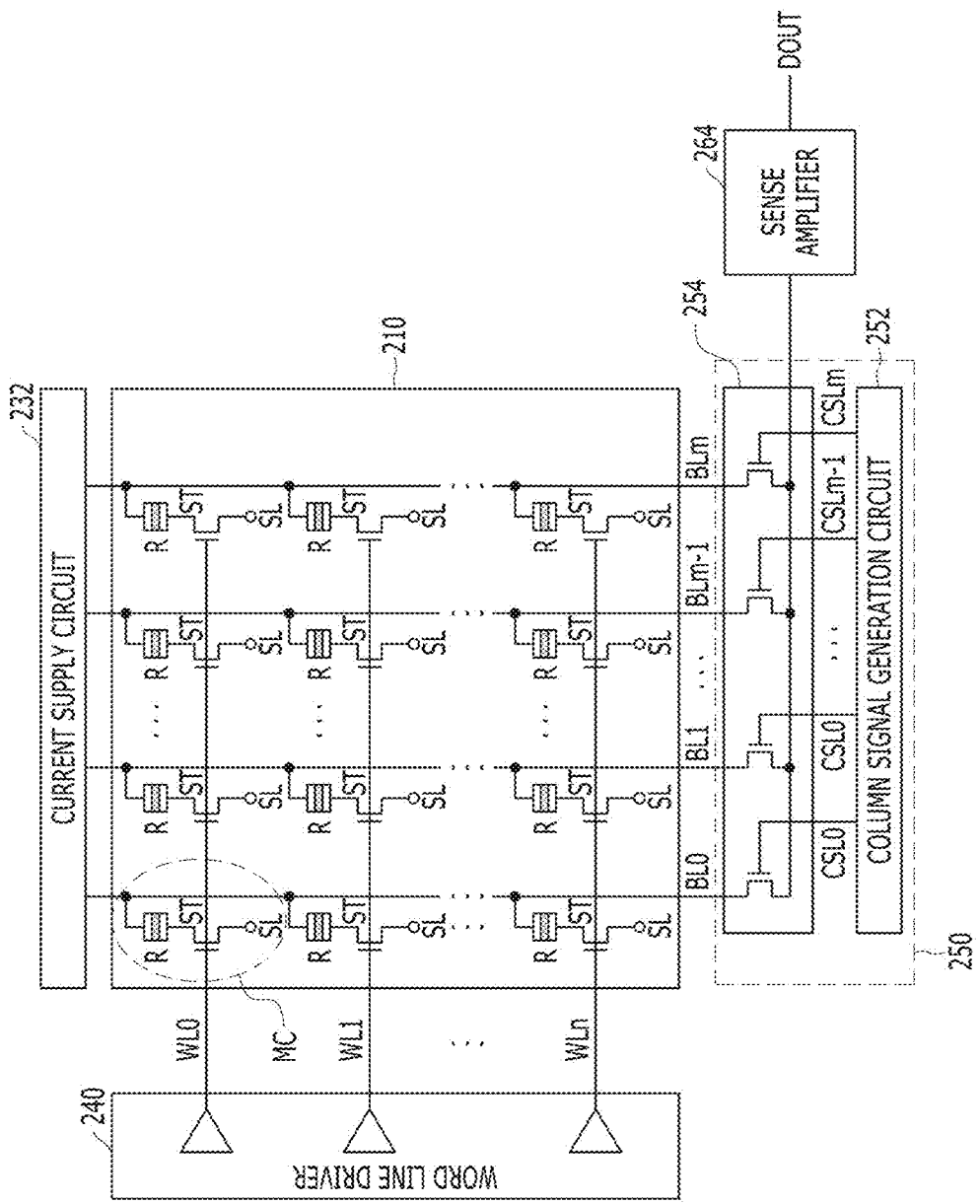
FIG. 6 is a configuration diagram illustrating a representation of an example of a memory cell array in accordance with an embodiment.

FIG. 6 is a configuration diagram illustrating a representation of an example of a memory cell array 210 in accordance with an embodiment.

Referring to FIG. 6, the memory cell array 210 may include a plurality of word lines WL0 to WLn (n being an integer greater than 0), a plurality of bit lines BL0 to BLm (m being an integer greater than 0), and a plurality of memory cells MC that are positioned at an intersection of the word lines WL0 to WLn and the bit lines BL0 to BLm.

In some implementations, the plurality of memory cells MC includes STTRAM cells. In this case, the plurality of memory cells MC may include a magnetic tunnel junction (MTJ) having magnetic materials. For example, each of the plurality of memory cells MC may be composed of or include a variable resistance element R and a switching transistor ST, as described in FIGS. 1 to 2B. The variable resistance element R may be coupled to a corresponding bit line BL. The variable resistance element R may have a resistance value varying depending on the size and/or direction of the current or voltage, and may have a non-volatile characteristic maintaining the resistance value even when the current or voltage is cut off. The switching transistor ST may be coupled between the variable resistance element R and a source line SL, and may be turned on in response to a corresponding word line drive signal provided from a word line driver 240.

In some implementations, the plurality of memory cells MC includes RRAM or PRAM having a cross-point structure. In this case, a selection element such as a diode or an ovonic threshold switch (OTS) may be used instead of the switching transistor ST. At this time, the variable resistance element R may be coupled between the selection element and one of the bit lines BL0 to BLm, and the selection element may be coupled between the variable resistance element R and one of the word lines WL0 to WLn. The selection element may be turned on in response to a potential difference between the word line WL and the bit line BL, which is applied to both ends of the memory cell MC. Hereinafter, a case where the memory cell MC is a STTRAM cell is explained as an example, but the proposed technology is not limited to it.

The word line driver 240 may output word line drive signals for driving the word lines WL0 to WLn, An element for decoding a row address may be provided within the word line driver 240, or a decoded row address from the row decoder shown in FIG. 5 may be provided to the word line driver 240.

A current supply circuit 232 may be coupled to the bit lines BL0 to BLm. The current supply circuit 232 may apply a write current to the bit lines BL0 to BLm during a write operation, and apply a read current to the bit lines BL0 to BLm during a read operation. The current supply circuit 232 may operate according to the command CMD or the control signal CTRL provided from the control logic 130 shown in FIG. 5.

The column decoder 250 may include a column signal generation circuit 252 and a column switch 254. The column signal generation circuit 252 may decode a column address to generate a plurality of column select signals CSL0 to CSLm to select at least one of the bit lines BL0 to BLm. The column switch 254 may select one of the bit lines BL0 to BLm depending on the column selection signals CSL0 to CSLm.

The sense amplifier 264 may sense and amplify read data provided from the selected bit line BL to output output data DOUT, during the read operation. In the example of implementing the proposed technology, the sense amplifier 264 may operate using the self-reference sensing scheme. Thus, a reference data of an external resistor having a fixed resistance value is not used. Instead, a specific data may be written in the memory cell MC, and the written data may be used as the reference data.

Figure 7:
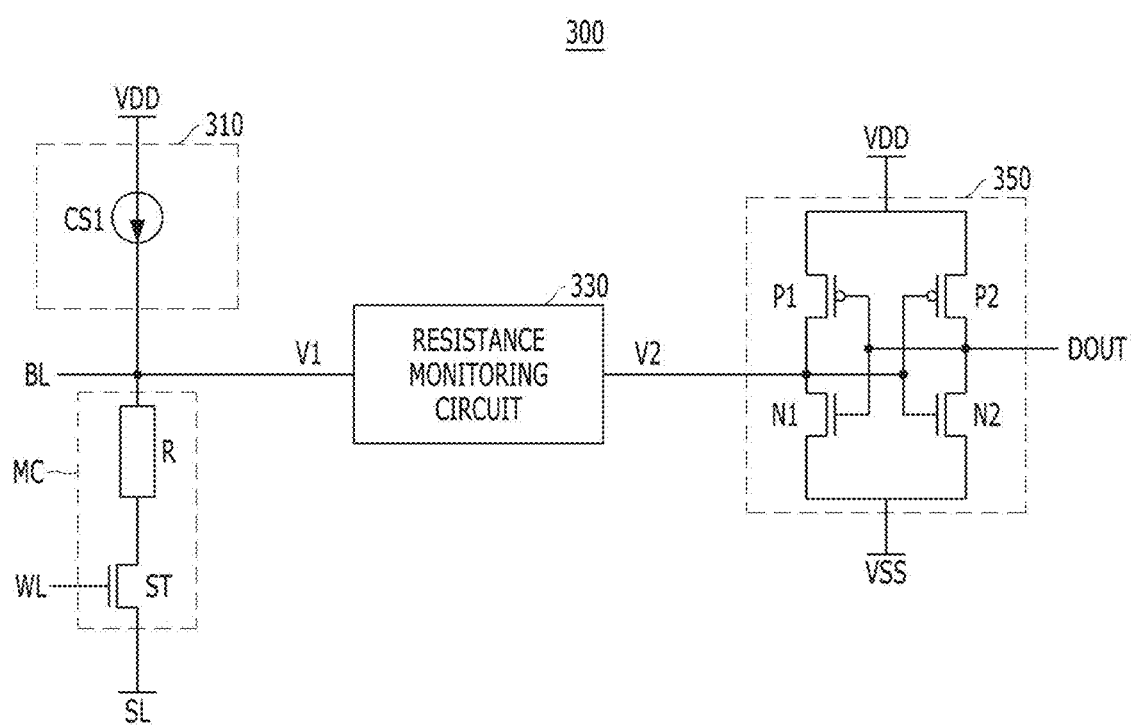
FIG. 7 is a configuration diagram illustrating a representation of an example of a semiconductor memory having a self-reference sensing scheme in accordance with a first embodiment.

FIG. 7 is a configuration diagram illustrating a representation of an example of a semiconductor memory 300 having a self-reference sensing scheme in accordance with a first embodiment. In FIG. 7, to help understand the illustrated embodiment, the composition of one memory cell MC and its associated peripheral circuits 310, 330, and 350 is illustrated. For reference, a plurality of memory cells are provided in a memory cell array, and the memory cells share the peripheral circuits such as the driving control circuit 310, the resistance monitoring circuit 330, and the sense amplifying circuit 350. In this case, a switching circuitry may be used to output data from the memory cells to those circuits for processing and generating the output data, according to an address.

Referring to FIG. 7, the semiconductor memory 300 may include a memory cell MC, a driving control circuit 310, a resistance monitoring circuit 330, and a sense amplifying circuit 350.

The memory cell MC may be coupled to a word line WL and a bit line BL. The memory cell MC may be implemented by including a variable resistance element R and a switching transistor ST. The memory cell MC as shown in FIG. 7 may have substantially the same configuration as any of the memory cell MC as shown in the memory cell array in FIGS. 5 and 6. The variable resistance element R may be coupled to the bit line BL, the switching transistor ST may be coupled between the variable resistance element R and a source line SL, and may be turned on when the word line WL is activated. Once the word line WL is activated, the memory cell MC may output a cell voltage corresponding to a resistance value of the variable resistance element R to the bit line BL. In FIG. 7, the cell voltage may be defined as a voltage V1 of the bit line BL.

The driving control circuit 310 may control a reference data to be written in the memory cell MC during a sensing operation. In the example of the implementation of the proposed technology, during the sensing operation, the read operation to read out data stored in the memory cell MC is performed. In addition, during the sensing operation, the write operation to write the reference data in the memory cell MC is also performed. Thus, the sensing operation includes both the read operation and the write operation. The reference data may be implemented as either 'high' data or 'low' data. The driving control circuit 310 may include at least one current source CS1 that provides a read current or a write current to the bit line BL coupled to the memory cell MC. The drive control circuit 310 may correspond to the control logic 130 of FIG. 5 or the current supply circuit 232 as shown in FIG. 6. The driving control circuit 310 may provide the write current to the memory cell MC according to the command CMD during the sensing operation, so that the reference data having a certain level is written in the memory cell MC.

The resistance monitoring circuit 330 may output a monitoring voltage V2 by monitoring a change in the resistance value of the memory cell MC according to the cell voltage V1 at the bit line BL during the write operation for writing the reference data. In some implementations, the resistance monitoring circuit 330 may be implemented as a differential circuit that differentiates the cell voltage V1 to output the monitoring voltage V2 corresponding to a slope of the cell voltage V1. The resistance monitoring circuit 330 may output the monitoring voltage V2 having a positive value (+) when the cell voltage V1 varies during the write operation of the reference data. The resistance monitoring circuit 330 may output the monitoring voltage V2 having a value of 0 when the cell voltage V1 does not vary during the write operation of the reference data. Examples of detailed compositions and operations of the resistance monitoring circuit 330 will be described in FIGS. 9 to 13B.

The sensor amplifying circuit 350 may sense and amplify the monitoring voltage V2 to output the amplified voltage as output data DOUT. For example, the sensor amplifier circuit 350 may be implemented as an invert latch connected in cross-couple type. The sensor amplifying circuit 350 may output the output data DOUT by inverting and amplifying the monitoring voltage V2. In some implementations, the sensor amplifying circuit 350 may include a first PMOS transistor P1, a second PMOS transistor P2, a first NMOS transistor N1, and a second NMOS transistor N2. The first PMOS transistor P1 and the first NMOS transistor N1 may be coupled in series between a supply voltage (VDD) terminal and a ground voltage (VSS) terminal, and have a gate receiving the output data DOUT. The second PMOS transistor P2 and the second NMOS transistor N2 may be coupled in series between the supply voltage (VDD) terminal and the ground voltage (VSS) terminal, and have a gate receiving the monitoring voltage V2. Drains of the first PMOS transistor P1 and the first NMOS transistor N1 may commonly coupled to an output node of the resistance monitoring circuit 330, i.e., a monitoring voltage (V2) terminal. Drains of the second PMOS transistor P2 and the second NMOS transistor N2 may commonly coupled to an output node of the sensor amplifying circuit 350, i.e., an output data (DOUT) terminal.

When the reference data is 'low' data, an additional inverter (not shown) may be provided at the back end of the sensor amplifying circuit 350, in order to match a phase of the original data of the memory cell MC with a phase of the output data DOUT. For reference, the resistance monitoring circuit 330 and the sense amplifying circuit 350 of FIG. 7 may correspond to the sense amplifier 264 of FIG. 6.

The driving control circuit 310 may control the original data of the memory cell MC to be written back to the memory cell MC based on the output data DOUT. The operation of writing the original data back to the memory cell MC is referred to as the write back operation. After the output data DOUT is output from the sensor amplifying circuit 350, the driving control circuit 310 may provide a write current to write back the original data in the memory cell MC. When the resistance value of the memory cell MC changes during the write operation of the reference data so that the cell voltage V1 varies, the driving control circuit 310 may perform the write back operation. On the other hand, when the resistance state of the memory cell MC does not change during the write operation of the reference data, the driving control circuit 310 may omit the write back operation.

Figure 8:
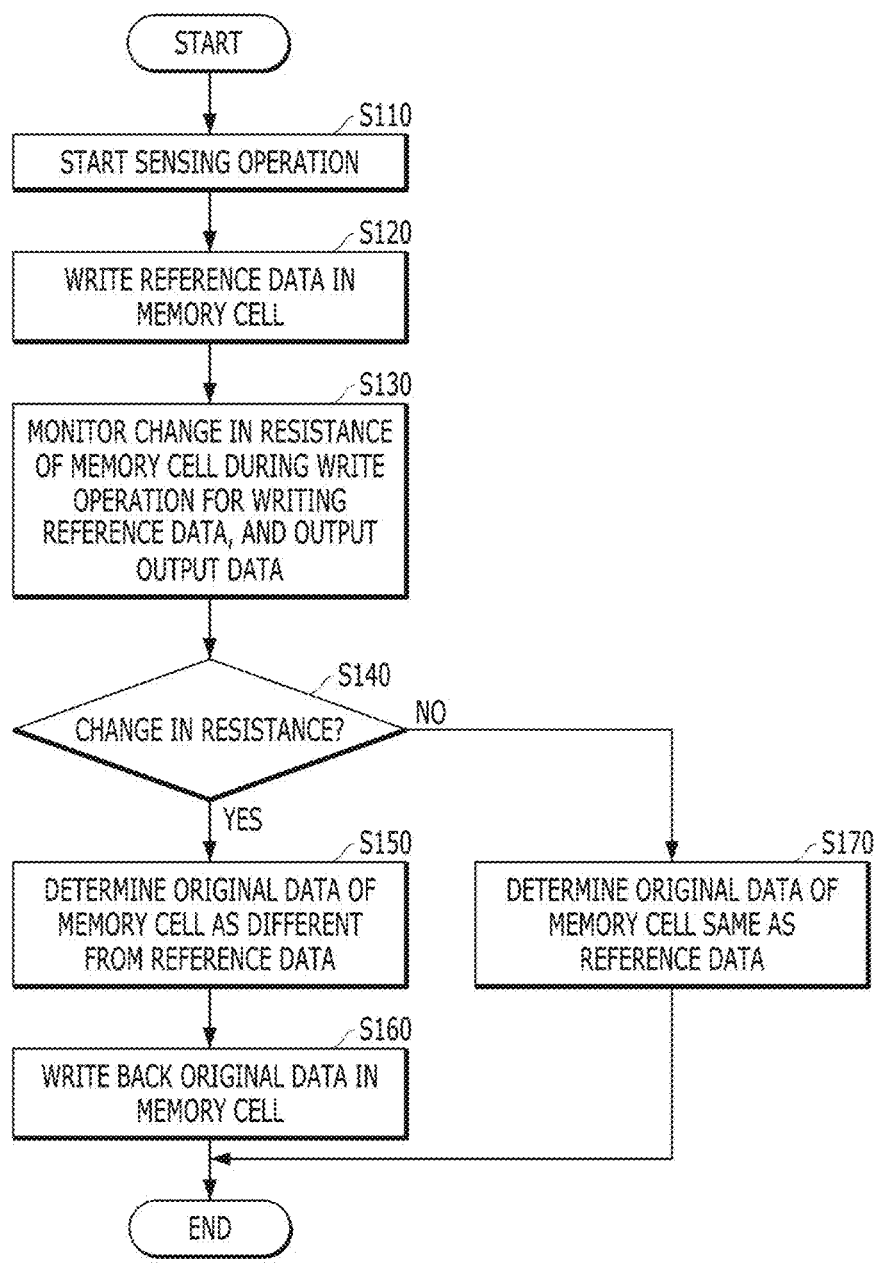
FIG. 8 is an example of a flow chart describing a self-reference sensing scheme of a semiconductor memory in accordance with an embodiment.

FIG. 8 is an example of a flow chart describing a self-reference sensing scheme of a semiconductor memory in accordance with an embodiment.

Referring to FIG. 8, the semiconductor memory 300 having a plurality of memory cells MC each including a variable resistance element R starts a sensing operation (at step S110).

The driving control circuit 310 controls the selected memory cell MC from the memory cells such that the reference data is to be written in the selected memory cell MC (at step S120). The reference data may be implemented as either 'high' data or 'low' data.

The resistance monitoring circuit 330 monitors the cell voltage V1 that is transferred to the bit line BL coupled to the selected memory cell MC during the write operation at step S120 for writing the reference data (at step S130). The resistance monitoring circuit 330 outputs the monitoring voltage V2 by monitoring a change in the resistance value of the selected memory cell MC based on the cell voltage V1. The resistance monitoring circuit 330 may differentiate the cell voltage V1 and output the monitoring voltage V2 corresponding to the slope of the cell voltage V1. Thus, in the proposed implementation, the data read from the selected memory cell MC after the reference data is written to the memory cell MC corresponds to the change in the resistance value of the selected memory cell MC. This is different from the operations as shown in FIG. 3 where the reference data is read from the selected memory cell after the reference data is written to the selected memory cell (see the operation S33 as shown in FIG. 3). Once the resistance monitoring circuit 330 outputs the monitoring voltage V2, the sensor amplifying circuit 350 senses and amplifies the monitoring voltage V2 and output the amplified monitoring voltage V2 as the output data DOUT.

The driving control circuit 310 controls the selected memory cell MC such that the original data of the selected memory cell MC is to be written back to the selected memory cell MC based on the output data DOU. For example, if the resistance value of the selected memory cell MC changes during the write operation at step S120 when writing the reference data ("Yes" at step S140), the driving control circuit 310 determines the original data of the selected memory cell MC as different from the reference data (at step S150). In this case, the driving control circuit 310 provides the write current to the selected memory cell MC to write back the original data to the selected memory cell MC (at step S160).

If the resistance state of the selected memory cell MC does not change during the write operation at step S120 when writing the reference data ("No" at step S140), the driving control circuit 310 determines the original data of the selected memory cell MC same as the reference data (at step S170). In this case, the driving control circuit 310 omits the write back operation without providing the write current to the selected memory cell MC.

In the self-reference sensing scheme in accordance with the proposed embodiment, the semiconductor memory may output the output data by writing the reference data in the memory cell and reading changes in the cell voltage in the memory cell. In self-reference sensing scheme in accordance with the proposed embodiment, the writing of the reference data and the reading of the changes in the cell voltage may be performed simultaneously. By simultaneously performing the writing operation and the read operation, it is possible to reduce time for performing the self-reference sensing scheme operates. For example, FIG. 3 shows four cycles of read-write-read-write (recovery) operations for the self-reference sensing scheme. The self-reference sensing scheme in accordance with the proposed embodiment may operate with the reduced cycles including i) write and read operations at the same time and ii) write (recovery) operation that is selectively performed based on whether there are changes in the cell voltage during the writing of the reference data. Considering that the write latency of non-volatile memory is shorter than the read latency, the self-reference sensing scheme proposed in this document can improve a speed of operation more than twice as fast as the self-reference sensing scheme as shown in FIG. 3.

Hereinafter, referring to FIGS. 9A to 11, an embodiment in case where the reference data is 'high' data will be explained.

Figure 9A:
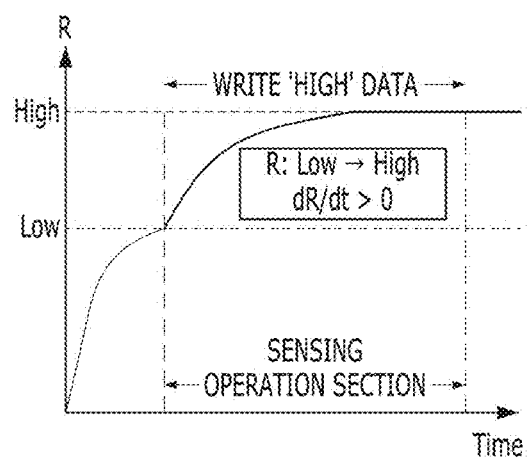
FIGS. 9A and 9B are representations of examples of graphs to explain an operation of a resistance monitoring circuit depending on a reference data.
Figure 9B:
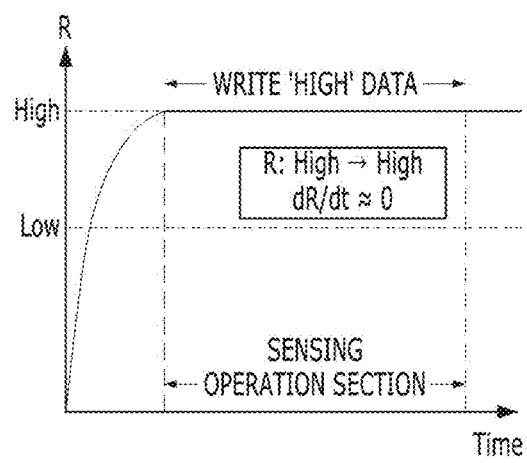

FIGS. 9A and 9B are representations of examples of graphs to explain an operation of the resistance monitoring circuit 330 depending on a write operation for writing a reference data of 'high' data.

Referring to FIG. 9A, it is shown that the reference data of the 'high' data is written when the variable resistance element R of the memory cell MC is in a low-resistance state. Since the write current is provided to write the 'high' data in the variable resistance element R during the sensing operation, the variable resistor device R becomes in a high-resistance state. In this case, the resistance variation over time (dR/dt) may have a value greater than zero.

Referring to FIG. 9B, it is shown that the reference data of the 'high' data is written when the variable resistance element R of the memory cell MC is in a high-resistance state. Since the variable resistance element R already has a high-resistance state, even if the write current is provided to write the 'high' data in the variable resistor element R during the sensing operation, there is no change in the state of the variable resistance element R and the variable resistance element R maintains a high-resistance state. In this case, the resistance variation over time (dR/dt) may have a value substantially the same as zero.

Figure 10A:
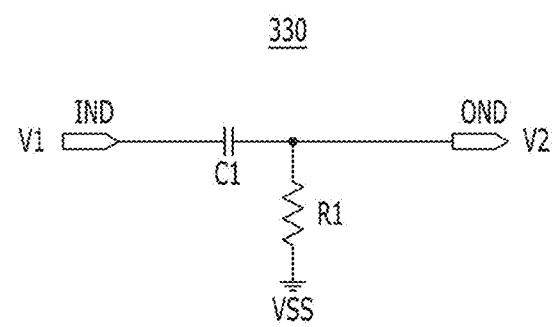
FIGS. 10A and 10B are configuration and timing diagrams illustrating a representation of an example of a resistance monitoring circuit shown in FIG. 7.
Figure 10B:
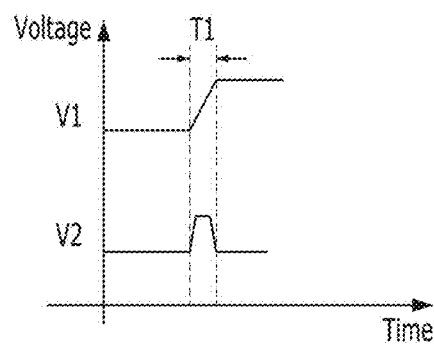

FIGS. 10A and 10B are configuration and timing diagrams illustrating a representation of an example of the resistance monitoring circuit 330 shown in FIG. 7.

Referring to FIG. 10A, the resistance monitoring circuit 330 may be implemented as a differential circuit that differentiates the cell voltage V1 to output the monitoring voltage V2 corresponding to a slope of the cell voltage V1. The resistance monitoring circuit 330 may include a capacitor C1 and a resistor R1. The capacitor C1 may be coupled between an input terminal IND receiving the cell voltage V1 and an output terminal OND outputting the monitoring voltage V2. The resistor R1 may be coupled between the output terminal OND and a ground voltage (VSS) terminal. The resistance monitoring circuit 330 may output the monitoring voltage V2 proportional to the differential value of the cell voltage V1. In this case, the cell voltage V1 and the monitoring voltage V2 may have a relationship according to the following Equation 1.

$$V2 = RC\frac{dV1}{dt} \quad \text{[Equation 1]}$$

Where R is a resistance of the resistor R1, C is a capacitance of the capacitor C1.

Referring to FIG. 10B, when the variable resistance element R changes from a low-resistance state to a high-resistance state during a sensing operation section (T1), the cell voltage V1 is changed (in FIG. 10B, for example, increase), and the resistance monitoring circuit 330 may output the monitoring voltage V2 having a positive value (+). During any other section than the sensing operation section (T2), the variable resistance element R maintains its resistance state without any changes, the cell voltage V1 is not changed, and the resistance monitoring circuit 330 may output the monitoring voltage V2 having a value of 0.

Figure 11:
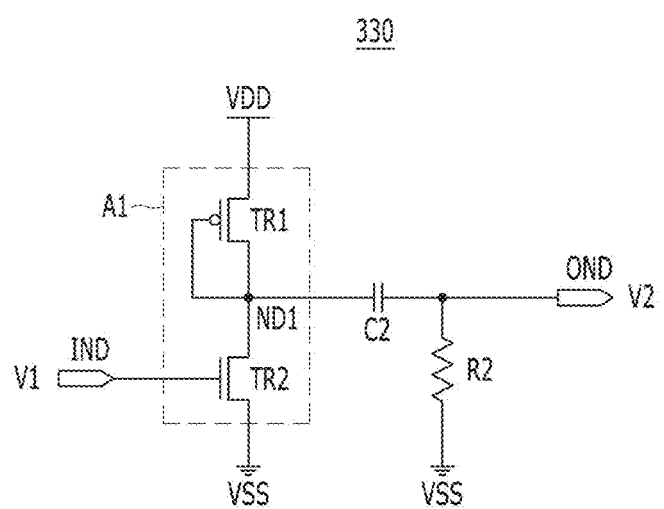
FIG. 11 is a configuration diagram illustrating a representation of another example of a resistance monitoring circuit shown in FIG. 7.

FIG. 11 is a configuration diagram illustrating a representation of another example of the resistance monitoring circuit 330 shown in FIG. 7.

Referring to FIG. 11, the resistance monitoring circuit 330 may include a capacitor C2, a resistor R2 and an amplifier A1. The amplifier A1 may include a first transistor TR1 and a second transistor TR2. The first transistor TR1 may be coupled between a supply voltage (VDD) terminal and a first node N1, and have a gate receiving a voltage of the first node N1. The second transistor TR2 may be coupled between the first node N1 and a ground voltage (VSS) terminal, and have a gate receiving the cell voltage V1 through an input terminal IND. The amplifier A1 may be a configuration to amplify the cell voltage V1. When the cell voltage V1 becomes lowered as an operating voltage of the semiconductor memory (i.e., a supply voltage VDD) decreases, the amplifier A1 may amplify the cell voltage V1 to provide the amplified cell voltage to a differential circuit R2 and C2 at a back end. In some implementations, the first transistor TR1 may be a PMOS transistor and the second transistor TR2 may be an NMOS transistor. The capacitor C2 may be coupled between a first node ND1 and an output terminal OND, and the resistance R2 may be coupled between the output terminal OND and the ground voltage (VSS) terminal. The resistance monitoring circuit 330 of FIG. 11 may perform substantially the same operation as the resistance monitoring circuit 330 of FIG. 10A.

Hereinafter, referring to FIGS. 12A to 13B, an embodiment in case where the reference data is 'low' data will be explained.

Figure 12A:
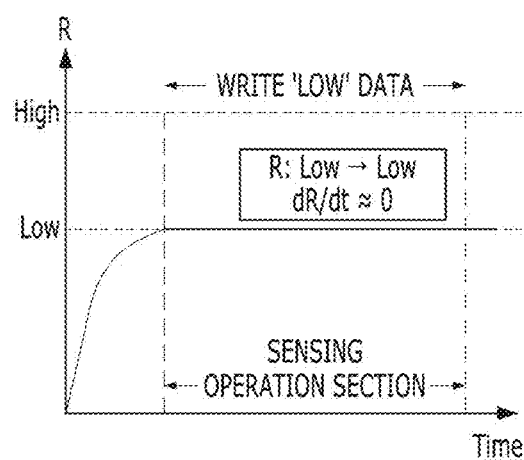
FIGS. 12A and 12B are representations of examples of graphs to explain an operation of a resistance monitoring circuit depending on a reference data.
Figure 12B:
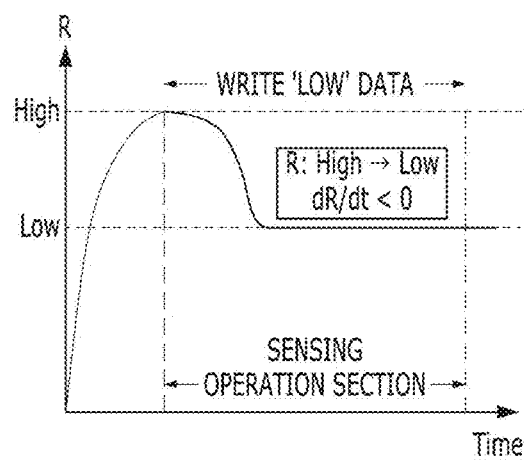

FIGS. 12A and 12B are representations of examples of graphs to explain an operation of the resistance monitoring circuit 330 during a write operation for writing a reference data of 'low' data.

Referring to FIG. 12A, it is shown that the reference data of the 'low' data is written when the variable resistance element R of the memory cell MC is in a low-resistance state. Even if the write current is provided to write the 'low' data in the variable resistance element R during the sensing operation, since the variable resistance element R already has the low-resistance state, there is no need to change the state of the variable resistance element R and the variable resistor device R maintains a low-resistance state. In this case, the resistance variation over time (dR/dt) may have a value substantially the same as zero.

Referring to FIG. 12B, it is shown that the reference data of the 'low' data is written when the variable resistance element R of the memory cell MC is in a high-resistance state. In this case, since the variable resistance element R has a high-resistance state, the state of the variable resistance element R needs to be changed to store 'low' data when the write current is provided to write the 'low' data in the variable resistor element R during the sensing operation. In this case, the resistance variation over time (dR/dt) may have a value lower than zero.

Figure 13A:
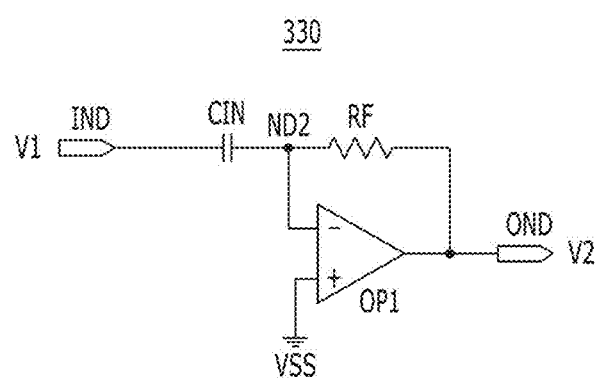
FIGS. 13A and 13B are configuration and timing diagrams illustrating a representation of another example of a resistance monitoring circuit shown in FIG. 7.
Figure 13B:
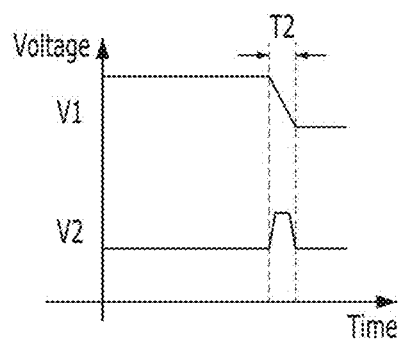

FIGS. 13A and 13B are configuration and timing diagrams illustrating a representation of another example of the resistance monitoring circuit 330 shown in FIG. 7.

Referring to FIG. 13A, the resistance monitoring circuit 330 may include a capacitor CIN, an operational amplifier OP1, and a resistor RF. The capacitor CIN may be coupled between an input terminal IND receiving the cell voltage V1 and a second node ND2. The operational amplifier OP1 may receive a voltage of the second node ND2 as a (−) input terminal and a ground voltage VSS as a (+) input terminal, and output the monitoring voltage V2 to an output terminal OND. The resistor RF may be coupled between the second node ND2 and the output terminal OND. The resistance monitoring circuit 330 may output the monitoring voltage V2 proportional to the differential value of the cell voltage V1. In this case, the cell voltage V1 and the monitoring voltage V2 may have a relationship according to the following Equation 2.

$$V2 = -RC\frac{dV1}{dt} \qquad \text{[Equation 2]}$$

Where R is a resistance of the resistor RF, C is a capacitance of the capacitor CIN.

Referring to FIG. 13B, when the variable resistance element R changes from a high-resistance state to a low-resistance state during a sensing operation section (T2), the cell voltage V1 is changed (in FIG. 13B, for example, decrease), and the resistance monitoring circuit 330 may output the monitoring voltage V2 having a positive value (+). During any other section than the sensing operation section (T2), the variable resistance element R maintains its resistance state without any changes, the cell voltage V1 is not changed, and the resistance monitoring circuit 330 may output the monitoring voltage V2 having a value of 0.

In the implementations above, the semiconductor memory is implemented based on an assumption that the reference data is fixed with either 'high' or 'low' data. In the following implementations, the semiconductor memory includes structures which are activated depending on whether the reference data has 'high' or 'low' data. In this case, the semiconductor memory can accomplish the self-reference sensing scheme even when the reference data for a present sensing operation has different value from a previous sensing operation.

Figure 14:
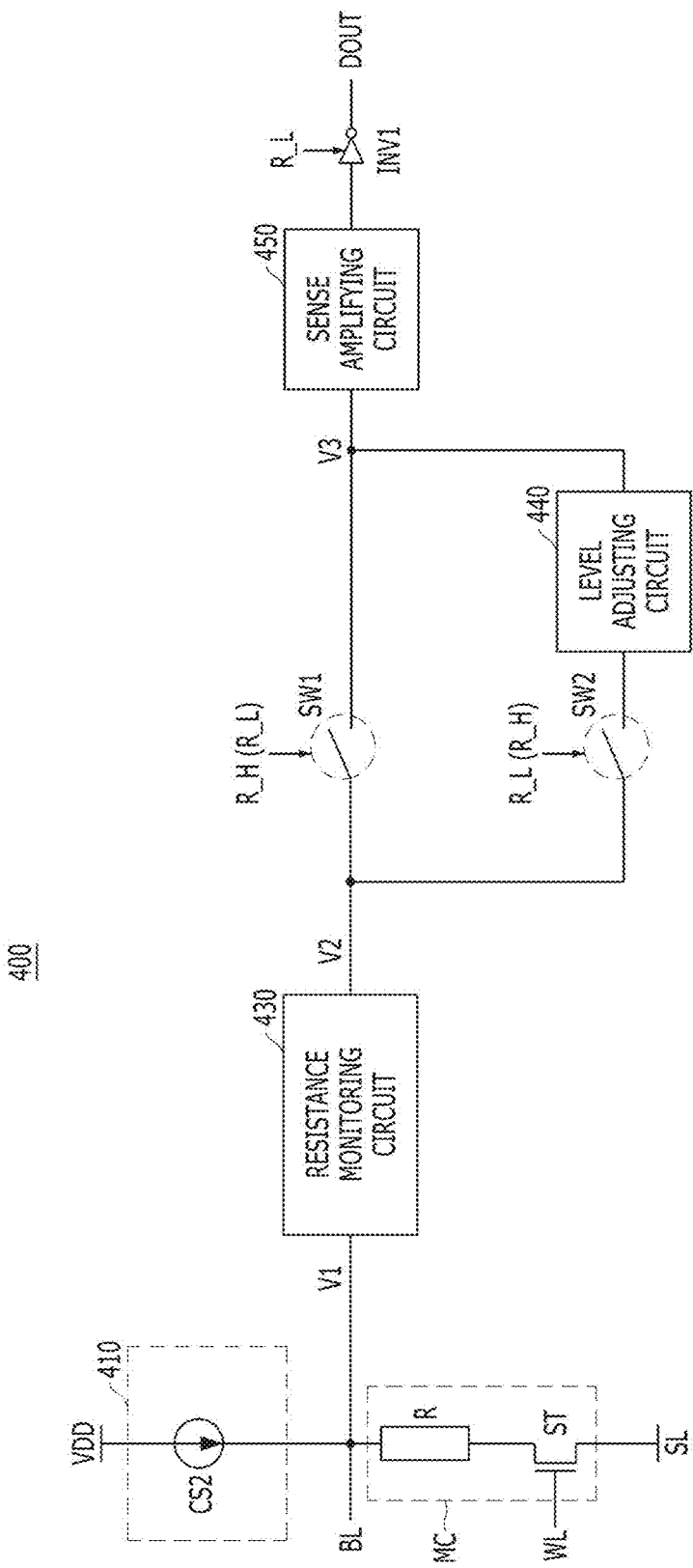
FIG. 14 is a configuration diagram illustrating a representation of an example of a semiconductor memory having a self-reference sensing scheme in accordance with a second embodiment.

FIG. 14 is a configuration diagram illustrating a representation of an example of a semiconductor memory 400 having a self-reference sensing scheme in accordance with an embodiment.

Referring to FIG. 14, the semiconductor memory 400 may include a memory cell MC, a driving control circuit 410, a resistance monitoring circuit 430, a first switch SW1, a second switch SW2, a level adjusting circuit 440, and a sense amplifying circuit 450.

The memory cell MC may be coupled to a word line WL and a bit line BL. The memory cell MC may be implemented as a variable resistance element R and a switching transistor ST. The memory cell MC of FIG. 14 may have substantially the same configuration as the memory cell MC of FIG. 7.

The driving control circuit 410 may control a reference data to be written in the memory cell MC during a sensing operation. The driving control circuit 410 may include at least one current source CS2 that provides a read current or a write current to the bit line BL coupled to the memory cell MC. The driving control circuit 410 of FIG. 14 may have substantially the same configuration as the driving control circuit 310 of FIG. 7.

The resistance monitoring circuit 430 may output a monitoring voltage V2 by monitoring a change in a resistance value of the memory cell MC according to the cell voltage V1 at the bit line BL during the write operation for writing the reference data. The resistance monitoring circuit 430 may output the monitoring voltage V2 having a positive value (+) or a negative value (−) when the cell voltage V1 varies during the write operation of the reference data. The resistance monitoring circuit 430 may output the monitoring voltage V2 having a value of 0 when the cell voltage V1 does not vary, during the write operation of the reference data. The detailed composition of the resistance monitoring circuit 430 will be described in FIGS. 15A to 16B.

The first switch SW1 may be coupled between the resistance monitoring circuit 430 and the sense amplifying circuit 450, and transfer the monitoring voltage V2 to the sense amplifying circuit 450 as an input voltage V3. The second switch SW2 may be coupled between the resistance monitoring circuit 430 and the level adjusting circuit 440, and transfer the monitoring voltage V2 to the level adjusting circuit 440. The first switch SW1 may be turned on in response to one of first and second reference select signals R_H and R_L, and the second switch SW2 may be turned on in response to the other of the first and second reference select signals R_H and R_L. The first reference select signal R_H is activated when the reference data is 'high' data, and the second reference select signal R_L is activated when the reference data is 'low' data. According to the first reference select signal R_H and the second reference select signal R_L, the first switch SW1 and the second switch SW2 may complementarily operate.

For reference, in a case where the resistance monitoring circuit 430 is implemented with an RC configuration of FIG. 10A or 11, the first switch SW1 may be turned on in response to the first reference select signal R_H, and the second switch SW2 may be turned on in response to the second reference select signal R_L. However, in case where the resistance monitoring circuit 430 is implemented with an operational amplifier (OP) configuration of FIG. 13A, the first switch SW1 may be turned on in response to the second reference select signal R_L, and the second switch SW2 may be turned on in response to the first reference select signal R_H.

The level adjusting circuit 440 may be disposed between the second switch SW2 and the sense amplifying circuit 450, and adjust a level of the monitoring voltage V2 transferred through the second switch SW2, and transfer the adjusted monitoring voltage to the sense amplifying circuit 450 as the input voltage V3. In some implementations, the level adjusting circuit 440 may adjust the level of the monitoring voltage V2 to transfer the adjusted monitoring voltage to the sense amplifying circuit 450, when the reference data is 'low' data. In some implementations, the level adjusting circuit 440 may include a level shifter (not shown) for up-shifting a level of the monitoring voltage V2, and an inverter (not shown) for inverting an output of the level shifter.

The sensor amplifying circuit 450 may sense and amplify the input voltage V3 to output the amplified voltage as output data DOUT. The sensor amplifying circuit 450 may output the output data DOUT by inverting and amplifying the input voltage V3. The sensor amplifying circuit 450 of FIG. 14 may have substantially the same configuration as the sensor amplifying circuit 350 of FIG. 7.

When the reference data is 'low' data, an additional inverter INV1 may be disposed at a back end of the sensor amplifying circuit 450 in order to match the phase of the output data DOUT with the original data in the memory cell MC, The inverter INV1 is activated according to the second reference selection signal R_L so as to invert the amplified voltage of the sensor amplifying circuit 450 to output the output data DOUT.

Figures 15A, 15B:
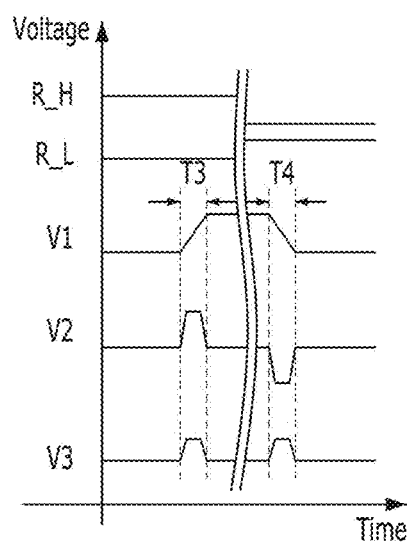
FIGS. 15A and 15B are a timing diagram and a table illustrating a representation of an example of an operation of a resistance monitoring circuit shown in FIG. 14.

FIGS. 15A and 15B are a timing diagram and a table illustrating a representation of an example of an operation of the resistance monitoring circuit 430 shown in FIG. 14. In FIGS. 15A and 15B, the resistance monitoring circuit 430 is implemented with an RC configuration as shown in FIG. 10A or 11.

Referring to FIG. 15A, the first reference select signal R_H is activated when the reference data is 'high' data. When the variable resistance element R is in a low-resistance state, the variable resistance element R changes from the low-resistance state into a high-resistance state, during the write operation for writing the reference data. The resistance monitoring circuit 430 may output the monitoring voltage V2 to have a positive value (+) during a sensing operation section (T3) where the cell voltage V1 increases. Since the first switch SW1 is turned on, the monitoring voltage V2 is transferred to the sense amplifying circuit 450 as the input voltage V3. The sensor amplifying circuit 450 may sense, amplify and invert the input voltage V3 to output the amplified voltage as the output data ROUT of 'low' data.

The second reference select signal R_L is activated when the reference data is 'low' data. When the variable resistance element R is in a high-resistance state, the variable resistance element R changes from the high-resistance state into a low-resistance state, during the write operation for writing the reference data. The resistance monitoring circuit 430 may output the monitoring voltage V2 to have a negative value during a sensing operation section (T4) where the cell voltage V1 decreases. Since the second switch SW2 is turned on, the monitoring voltage V2 is transferred to the level adjusting circuit 440. The level adjusting circuit 440 may adjust a level of the monitoring voltage, and transfer the adjusted monitoring voltage to the sense amplifying circuit 450 as the input voltage V3. The sensor amplifying circuit 450 may sense, amplify and invert the input voltage V3 to output the amplified voltage. At this time, the inverter INV1 may invert the amplified voltage of the sensor amplifying circuit 450 to output the output data DOUT of 'high" data.

Referring to FIG. 15B, the driving control circuit 410 may control the original data of the memory cell MC to be written back to the memory cell MC, by determining whether the write back operation is required, according to the output data DOUT. For example, when the input voltage V3 varies into a positive value (+) since the resistance value of the memory cell MC changes during the write operation of the reference data of 'high' data, the output data DOUT of 'low' data is outputted. At this time, the driving control circuit 310 performs the write back operation to write back the original data of 'low' data into the memory cell MC. On the contrary, when the input voltage V3 maintains 0 V since the resistance value of the memory cell MC maintains its state during the write operation of the reference data of 'high' data, the driving control circuit 310 may omit the write back operation.

For example, when the input voltage V3 varies into a positive value (+) since the resistance value of the memory cell MC changes during the write operation of the reference data of 'low' data, the output data DOUT of 'high' data is outputted. At this time, the driving control circuit 310 performs the write back operation to write back the original data of 'high' data into the memory cell MC. On the contrary, when the input voltage V3 maintains 0 V since the resistance value of the memory cell MC maintains its state during the write operation of the reference data of 'low' data, the driving control circuit 310 may omit the write back operation.

Figures 16A, 16B:
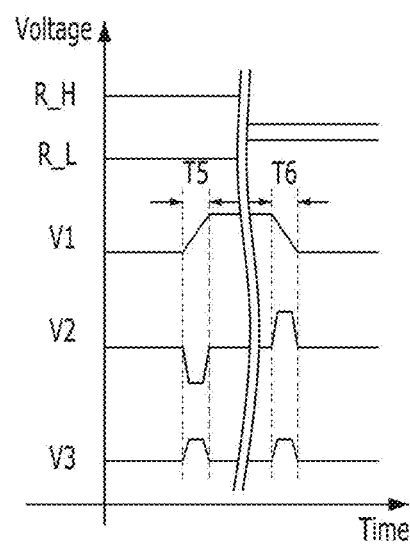
FIGS. 16A and 16B are a timing diagram and a table illustrating a representation of another example of an operation of a resistance monitoring circuit shown in FIG. 14.

FIGS. 16A and 16B are a timing diagram and a table illustrating a representation of another example of an operation of the resistance monitoring circuit 430 shown in FIG. 14. In FIGS. 16A and 16B, a case where the resistance monitoring circuit 430 is implemented with an operational amplifier (OP) configuration of FIG. 13A is shown.

Referring to FIG. 16A, the first reference select signal R_H is activated when the reference data is 'high' data. When the variable resistance element R is in a low-resistance state, the variable resistance element R changes from the low-resistance state into a high-resistance state, during the write operation for writing the reference data. The resistance monitoring circuit 430 may output the monitoring voltage V2 to have a negative value (−) during a sensing operation section (T5) where the cell voltage V1 increases. Since the second switch SW2 is turned on, the monitoring voltage V2 is transferred to the level adjusting circuit 440. The level adjusting circuit 440 may adjust a level of the monitoring voltage, and transfer the adjusted monitoring voltage to the sense amplifying circuit 450 as the input voltage V3. The sensor amplifying circuit 450 may sense, amplify and invert the input voltage V3 to output the amplified voltage as the output data DOUT of 'low'' data.

Meanwhile, the second reference select signal is activated when the reference data is 'low' data. When the variable resistance element R is in a high-resistance state, the variable resistance element R changes from the high-resistance state into a low-resistance state, during the write operation for writing the reference data. The resistance monitoring circuit 430 may output the monitoring voltage V2 to have a positive value (+) during a sensing operation section (T6) where the cell voltage V1 decreases. Since the first switch SW1 is turned on, the monitoring voltage V2 is transferred to the sense amplifying circuit 450 as the input voltage V3. The sensor amplifying circuit 450 may sense, amplify and invert the input voltage V3 to output the amplified voltage. At this time, the inverter INV1 may invert the amplified voltage of the sensor amplifying circuit 450 to output the output data DOUT of 'high'' data.

Referring to FIG. 16B, the driving control circuit 410 may control the original data of the memory cell MC to be written back to the memory cell MC, by determining whether the write back operation is required, according to the output data DOUT. For example, when the input voltage V3 varies into a positive value (+) since the resistance value of the memory cell MC changes during the write operation of the reference data, the driving control circuit 310 performs the write back operation to write back the original data into the memory cell MC. On the contrary, when the input voltage V3 maintains 0 V since the resistance value of the memory cell MC maintains its state during the write operation of the reference data, the driving control circuit 310 may omit the write back operation.

As mentioned above, the semiconductor memory 400 may provide the self-reference sensing scheme that can perform selective operations depending on whether the reference data has 'high' or 'low' data.

Figure 17:
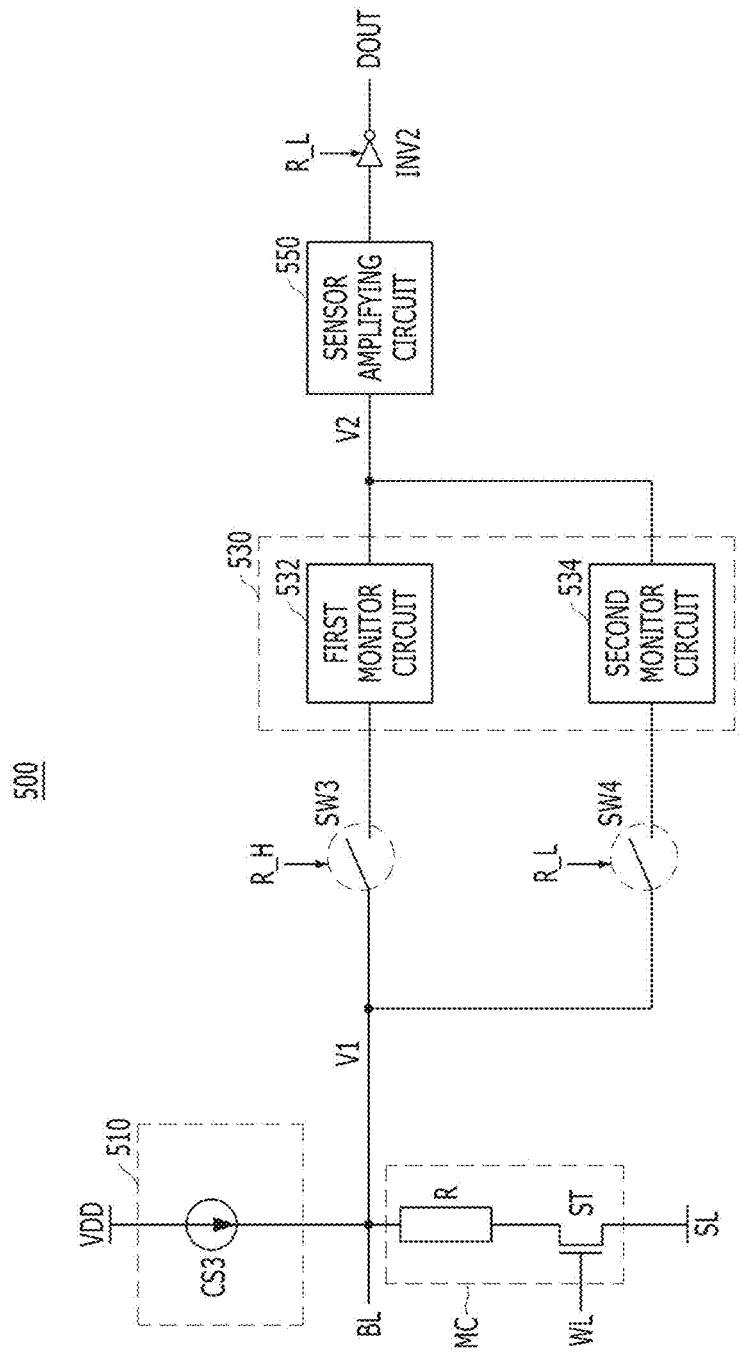
FIG. 17 is a configuration diagram illustrating a representation of an example of a semiconductor memory having a self-reference sensing scheme in accordance with a third embodiment.

FIG. 17 is a configuration diagram illustrating a representation of an example of a semiconductor memory 500 having a self-reference sensing scheme in accordance with another embodiment.

Referring to FIG. 17, the semiconductor memory 500 may include a memory cell MC, a driving control circuit 510, a first switch SW3, a second switch SW4, a resistance monitoring circuit 530, and a sense amplifying circuit 550.

The memory cell MC may be coupled to a word line WL and a bit line BL. The memory cell MC may be implemented as a variable resistance element R and a switching transistor ST. The memory cell MC of FIG. 17 may have substantially the same configuration as the memory cell MC of FIG. 7.

The driving control circuit 510 may control a reference data to be written in the memory cell MC during a sensing operation. The driving control circuit 510 may include at least one current source CS3 that provides a read current or a write current to the bit line BL coupled to the memory cell MC. The driving control circuit 510 of FIG. 17 may have substantially the same configuration as the driving control circuit 310 of FIG. 7.

The resistance monitoring circuit 530 may output a monitoring voltage V2 by monitoring a change in a resistance value of the memory cell MC according to the cell voltage V1 at the bit line BL during the write operation for writing the reference data. The resistance monitoring circuit 530 may include a first monitor circuit 532 and a second monitor circuit 534. The first monitor circuit 532 may be implemented with an RC configuration of FIG. 10A or 11, and output the monitoring voltage V2 proportional to the differential value of the cell voltage V1 according to the Equation 1. The second monitor circuit 534 may be implemented with an operational amplifier (OP) configuration of FIG. 13A, and output the monitoring voltage V2 proportional to the differential value of the cell voltage V1 according to the Equation 2. The first monitor circuit 532 and the second monitor circuit 534 may output the monitoring voltage V2 having a positive value (+) when the cell voltage V1 changes, and output the monitoring voltage V2 to maintain a value of 0 when the cell voltage V1 does not change, during the write operation of the reference data.

The first switch SW3 may be coupled between the bit line BL and the first monitor circuit 532, and transfer the cell voltage V1 to the first monitor circuit 532. The second switch SW4 may be coupled between the bit line BL and the second monitor circuit 534, and transfer the cell voltage V1 to the second monitor circuit 534. The first switch SW3 may be turned on in response to a first reference select signal R_H, and the second switch SW4 may be turned on in response to a second reference select signal R_L.

The sensor amplifying circuit 550 may sense and amplify the monitoring voltage V2 to output the amplified voltage as output data DOUT. The sensor amplifying circuit 550 may output the output data DOUT by inverting and amplifying the monitoring voltage V2. The sensor amplifying circuit 550 of FIG. 17 may have substantially the same configuration as the sensor amplifying circuit 350 of FIG. 7.

Meanwhile, in case where the reference data is 'low' data, an additional inverter INV2 may be disposed at a back end of the sensor amplifying circuit 450 in order to match the phase of the output data DOUT with the original data in the memory cell MC. The inverter INV2 is activated according to the second reference selection signal so as to invert the amplified voltage of the sensor amplifying circuit 550 to output the output data DOUT.

Hereinafter, an operation of the semiconductor memory 500 will be explained.

The first reference select signal R_H is activated when the reference data is 'high' data. Since the first switch SW3 is turned on, the cell voltage V1 is transferred to the first monitor circuit 532. The first monitor circuit 532 monitors the variable resistance element R changing from a low-resistance state into a high-resistance state, during the write operation for writing the reference data. That is, the first monitor circuit 532 may output the monitoring voltage V2 to have a positive value (+) during a sensing operation section where the cell voltage V1 increases. The sensor amplifying circuit 550 may sense, amplify and invert the monitoring voltage V2 to output the amplified voltage as the output data DOUT.

Meanwhile, the second reference select signal is activated when the reference data is 'low' data. Since the second switch SW4 is turned on, the cell voltage V1 is transferred to the second monitor circuit 534. The second monitor circuit 534 monitors the variable resistance element R changing from a high-resistance state into a low-resistance state, during the write operation for writing the reference data. Thus, the second monitor circuit 534 may output the monitoring voltage V2 to have a positive value (+) during a sensing operation section where the cell voltage V1 decreases. The sensor amplifying circuit 550 may sense, amplify and invert the monitoring voltage V2, and the inverter INV2 may invert the amplified voltage of the sensor amplifying circuit 550 to output the output data DOUT.

The semiconductor memory 500 which performs operations using the self-reference sensing scheme as described in this patent document can selectively activate the first switch SW3 or the second switch SW4 based on whether the reference data has either 'high' or 'low' data.

According to the electronic devices according to the above-described embodiments, the semiconductor memory may output the output data by reading changes in the cell voltage in the memory cell while writing the data in the memory cell at the same time. Thus, it is possible to reduce read error while reducing read latency in a self-reference sensing scheme.

The above and other memory circuits or semiconductor devices based on the disclosed technology may be used in a range of devices or systems. FIGS. 18 to 22 provide some examples of devices or systems that may implement the memory circuits disclosed herein.

Figure 18:
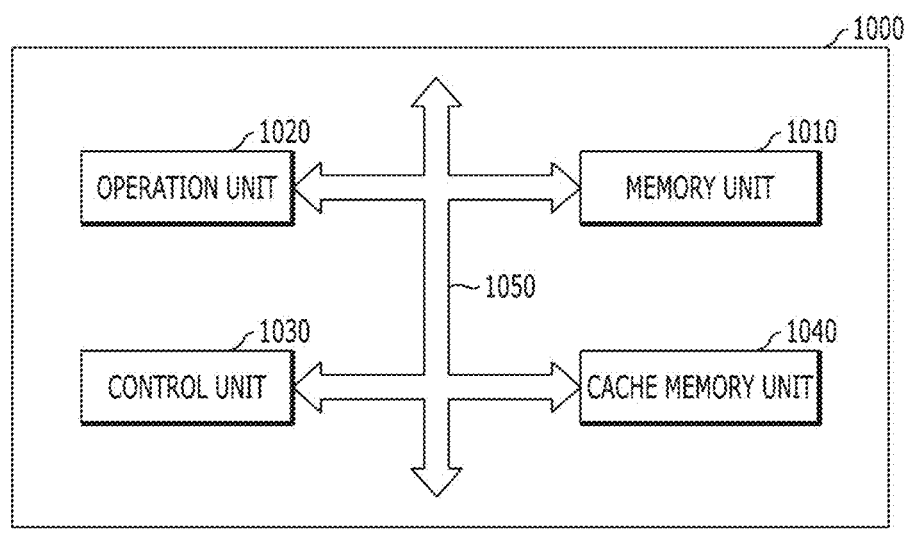
FIG. 18 is a configuration diagram illustrating an example of a microprocessor which is implemented with a memory device in accordance with an embodiment.

FIG. 18 is an example of configuration diagram of a microprocessor 1000 implementing memory circuitry based on the disclosed technology.

Referring to FIG. 18, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the memory unit 2010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 19:
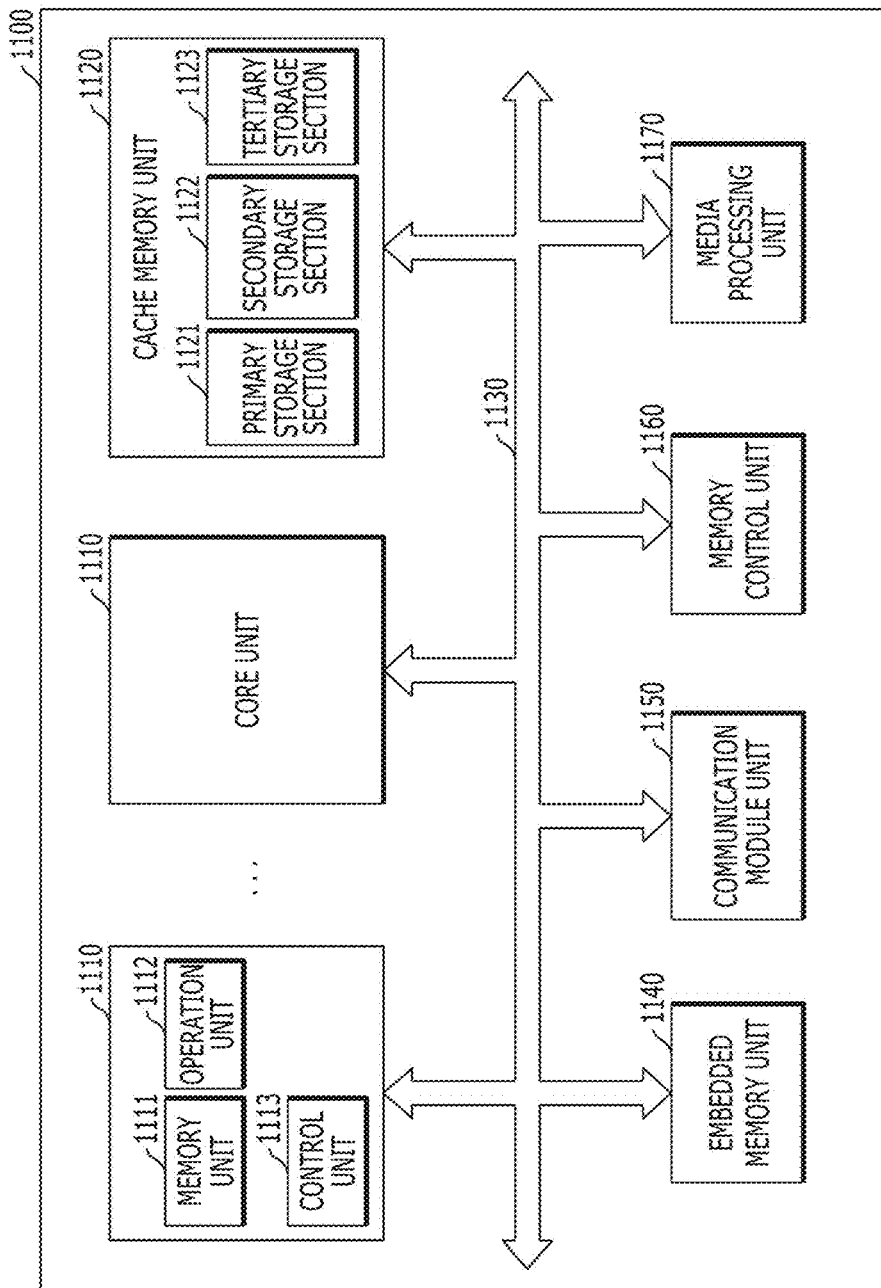
FIG. 19 is a configuration diagram illustrating an example of a processor which is implemented with a memory device in accordance with an embodiment.

FIG. 19 is an example of configuration diagram of a processor 1100 implementing memory circuitry based on the disclosed technology.

Referring to FIG. 19, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the cache memory unit 1120 may be improved. As a consequence, performance characteristics of the processor 1100 may be improved.

Although it was shown in FIG. 19 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 20:
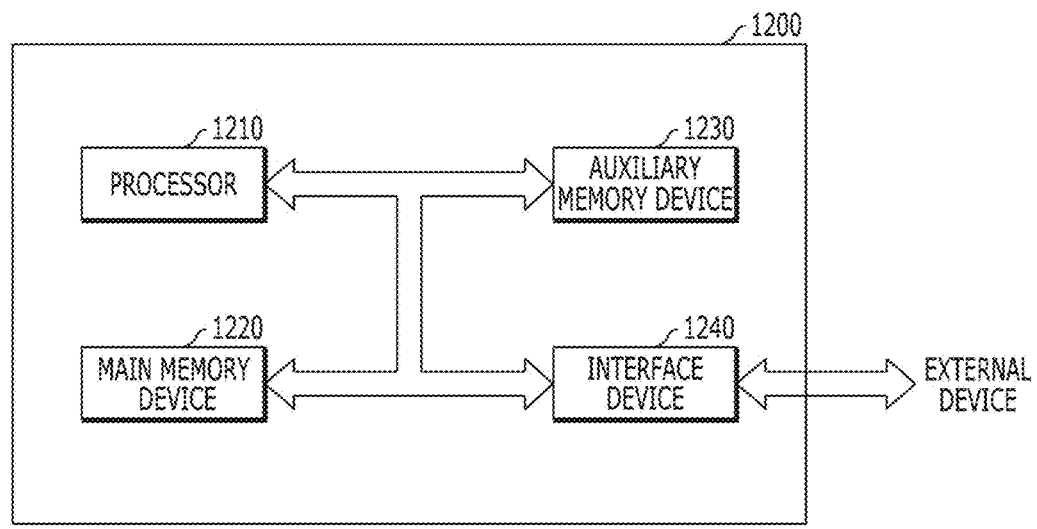
FIG. 20 is a configuration diagram illustrating an example of a system which is implemented with a memory device in accordance with an embodiment.

FIG. 20 is an example of configuration diagram of a system 1200 implementing memory circuitry based on the disclosed technology.

Referring to FIG. 20, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 21) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 21) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 21:
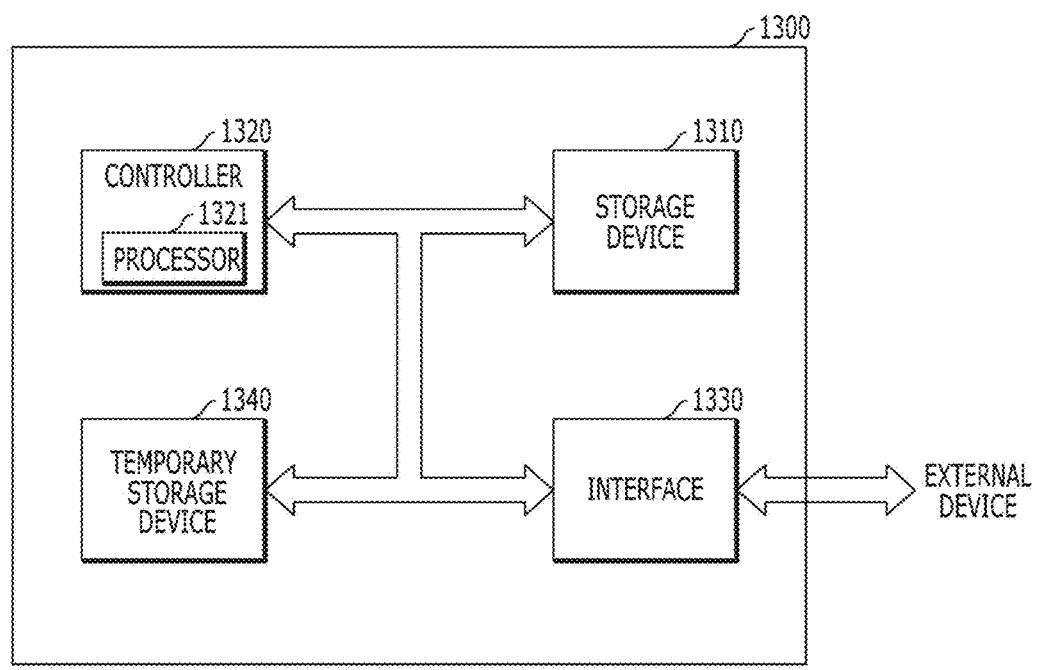
FIG. 21 is a configuration diagram illustrating an example of a data storage system which is implemented with a memory device in accordance with an embodiment.

FIG. 21 is an example of configuration diagram of a data storage system 1300 implementing memory circuitry based on the disclosed technology.

Referring to FIG. 21, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the temporary storage device 1340 may be improved. As a consequence, performance characteristics of the system 1300 may be improved.

Figure 22:
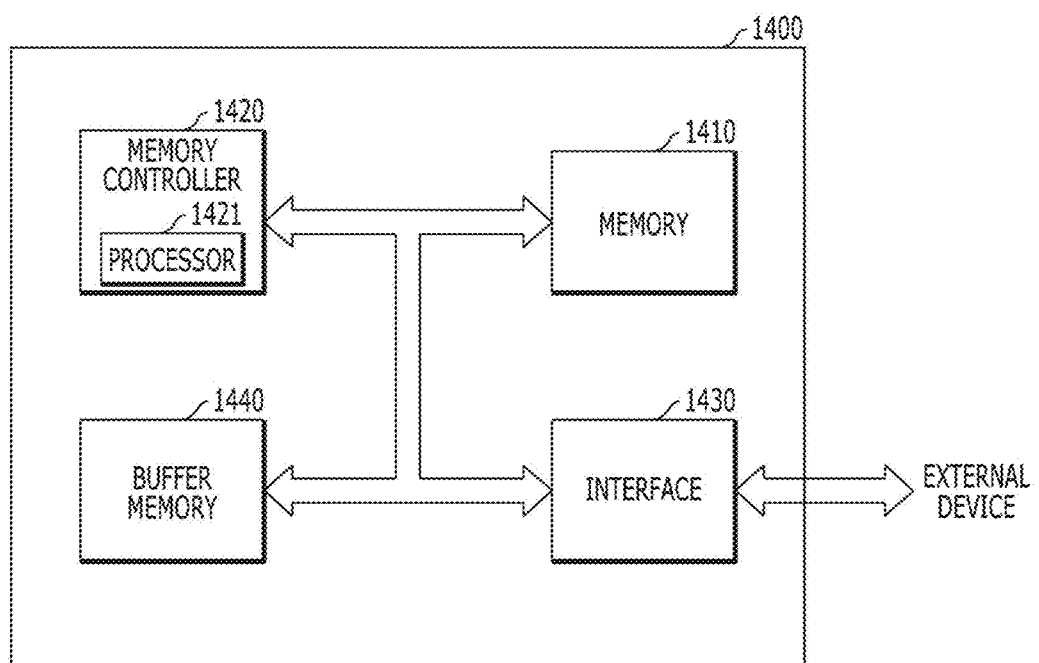
FIG. 22 is a configuration diagram illustrating an example of a memory system which is implemented with a memory device in accordance with an embodiment.

FIG. 22 is an example of configuration diagram of a memory system 1400 implementing memory circuitry based on the disclosed technology.

Referring to FIG. 22, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the memory 1410 may be improved. As a consequence, performance characteristics of the microprocessor 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 14211 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of memory cells each including a variable resistance element and outputting a cell voltage corresponding to a resistance value of the variable resistance element to a corresponding bit line; a driving control circuit suitable for controlling a reference data to be written in a selected memory cell among the memory cells, during a sensing operation; a resistance monitoring circuit suitable for outputting a monitoring voltage by monitoring a change in the resistance value according to the cell voltage at the bit line during a write operation for writing the reference data; and a sensor amplifying circuit suitable for sensing and amplifying the monitoring voltage to output output data. Through this, characteristics of the buffer memory 1440 may be improved. As a consequence, performance characteristics of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a variable resistance element is easy, and it is possible to secure the characteristics of the variable resistance element.

Features in the above examples of electronic devices or systems in FIGS. 18-22 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device including a semiconductor memory, the semiconductor memory comprising:
   a memory cell array of a plurality of memory cells each including a variable resistance element exhibiting different resistance values representing different digital information and outputting, to a corresponding bit line, a cell voltage corresponding to a resistance value of the variable resistance element;
   a driving control circuit coupled to the memory cell array and operable to control a reference data to be written in a selected memory cell among the memory cells, during a sensing operation;
   a resistance monitoring circuit coupled to the memory cell array and operable to output a monitoring voltage by monitoring, during a write operation for writing the reference data, a change in the resistance value based on the cell voltage at the bit line; and
   an amplifying circuit coupled to the resistance monitoring circuit and operable to amplify the monitoring voltage and output an amplified monitoring voltage as output data.

2. The electronic device according to claim 1, wherein the variable resistance element is configured to store different data depending on whether the variable resistance element has a high resistance state or a low resistance state.

3. The electronic device according to claim 1, wherein the resistance monitoring circuit includes:
   a differential circuit configured to differentiate the cell voltage and output the monitoring voltage based on the change of the cell voltage.

4. The electronic device according to claim 1, wherein the semiconductor memory further includes:
a level adjusting circuit configured to adjust a level of the monitoring voltage and transfer the adjusted monitoring voltage to the amplifying circuit.

5. The electronic device according to claim 4, wherein the resistance monitoring circuit is configured to output the monitoring voltage having a positive value (+), a value of 0, or a negative value (−).

6. The electronic device according to claim 1, wherein the resistance monitoring circuit includes:
a capacitor coupled between an input terminal receiving the cell voltage and an output terminal outputting the monitoring voltage; and
a resistor coupled between the output terminal and a ground voltage terminal.

7. The electronic device according to claim 1, wherein the resistance monitoring circuit includes:
a first transistor coupled between a supply voltage terminal and a first node, and having a gate receiving a voltage of the first node;
a second transistor coupled between the first node and a ground voltage terminal, and having a gate receiving the cell voltage;
a capacitor coupled between the first node and an output terminal outputting the monitoring voltage; and
a resistor coupled between the output terminal and the ground voltage terminal.

8. The electronic device according to claim 1, wherein the resistance monitoring circuit includes:
a capacitor coupled between an input terminal receiving the cell voltage and a second node;
an operational amplifier configured to receive a voltage of the second node as a negative input terminal and a ground voltage as a positive input terminal, and output the monitoring voltage to an output terminal; and
a resistor coupled between the second node and the output terminal.

9. The electronic device according to claim 1, wherein the resistance monitoring circuit includes:
a first monitor circuit configured to operate in response to a signal activated when the reference data has a high resistance state and to output the monitoring voltage by monitoring the change in the resistance value according to the cell voltage; and
a second monitor circuit configured to operate in response to a signal activate suitable for outputting the monitoring voltage by monitoring the change in the resistance value according to the cell voltage, in case where the reference data is 'low' data.

10. The electronic device according to claim 9, wherein the first monitor circuit includes:
a capacitor coupled between an input terminal receiving the cell voltage and an output terminal outputting the monitoring voltage; and
a resistor coupled between the output terminal and a ground voltage terminal.

11. The electronic device according to claim 9, wherein the first monitor circuit includes:
a first transistor coupled between a supply voltage terminal and a first node, and having a gate receiving a voltage of the first node;
a second transistor coupled between the first node and a ground voltage terminal, and having a gate receiving the cell voltage;
a capacitor coupled between the first node and an output terminal outputting the monitoring voltage; and
a resistance element coupled between the output terminal and the ground voltage terminal.

12. The electronic device according to claim 9, wherein the second monitor circuit includes:
a capacitor coupled between an input terminal receiving the cell voltage and a second node;
an operational amplifier configured to receive a voltage of the second node as a negative input terminal and a ground voltage as a positive input terminal, and to output the monitoring voltage to an output terminal; and
a resistance element coupled between the second node and the output terminal.

13. The electronic device according to claim 1, wherein the driving control circuit is configured to allow an original data stored in the selected memory cell to be written, after the sensing operation, back to the selected memory cell based on the output data, wherein a read operation for reading the original data from the selected memory cell is omitted before and during the sensing operation.

14. The electronic device according to claim 13, wherein the driving control circuit is configured to allow the original data to be written back to the selected memory cell when the output data indicates that there exists the change in the resistance value during the sensing operation.

15. The electronic device according to claim 1, wherein the driving control circuit includes:
at least one current source configured to provide a read current or a write current to the bit line coupled to the selected memory cell.

16. The electronic device according to claim 1, wherein the amplifying circuit includes inverters that are cross coupled.

17. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

18. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

19. The electronic device of claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

20. The electronic device of claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

21. The electronic device of claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

22. A method of operating an electronic device having a semiconductor memory, comprising:

writing a reference data in a selected memory cell among memory cells included in the semiconductor memory, each memory cell including a variable resistance element that exhibits either high or low resistance value;

outputting a monitoring voltage by monitoring, during the writing of the reference data, a change in a resistance value of the selected memory cell based on a cell voltage at a bit line coupled to the selected memory cell; and amplifying the monitoring voltage and outputting the amplified monitoring voltage as output data.

23. The method of claim 22, wherein the monitoring of the change in the resistance value of the selected memory cell includes:

differentiating the cell voltage to output the monitoring voltage.

24. The method of claim 22, further comprising:

writing the original data to the selected memory cell based on the output data, wherein a reading operation for reading the original data from the selected memory cell is omitted before the writing of the original data to the selected memory cell.

25. The method of claim 24, wherein the writing of the original data is performed when the output data indicates that there exists the change in the resistance value.

26. The method of claim 22, further comprising: adjusting a level of the monitoring voltage.

27. The method of claim 26, wherein the adjusted level of the monitoring voltage has a positive value (+), a value of 0, or a negative value (−).

* * * * *